(12) United States Patent
Sakui et al.

(10) Patent No.: US 12,100,443 B2
(45) Date of Patent: Sep. 24, 2024

(54) SEMICONDUCTOR-ELEMENT-INCLUDING MEMORY DEVICE

(71) Applicant: Unisantis Electronics Singapore Pte. Ltd., Singapore (SG)

(72) Inventors: Koji Sakui, Tokyo (JP); Riichiro Shirota, Hsinchu (TW); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 160 days.

(21) Appl. No.: 18/076,175

(22) Filed: Dec. 6, 2022

(65) Prior Publication Data

US 2023/0178145 A1 Jun. 8, 2023

(30) Foreign Application Priority Data

Dec. 7, 2021 (WO) .................. PCT/JP2021/044837

(51) Int. Cl.
*G11C 11/4094* (2006.01)
*G11C 11/4096* (2006.01)
(Continued)

(52) U.S. Cl.
CPC ...... *G11C 11/4096* (2013.01); *G11C 11/4094* (2013.01); *G11C 16/24* (2013.01); *H10B 12/20* (2023.02); *G11C 2211/401* (2013.01)

(58) Field of Classification Search
CPC . G11C 11/4096; G11C 11/4094; G11C 16/24; G11C 2211/401; H10B 12/20
(Continued)

(56) References Cited

U.S. PATENT DOCUMENTS 11,763,877 B2 * 9/2023 Sakui ................. G11C 7/04
 365/185.29
11,823,727 B2 * 11/2023 Sakui .................. G11C 16/26
(Continued)

FOREIGN PATENT DOCUMENTS

JP H 02-188966 A 7/1990
JP H 03-171768 A 7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Ly D Pham
(74) *Attorney, Agent, or Firm* — Crowell & Moring LLP

(57) ABSTRACT

A memory device includes pages each constituted by memory cells, and a page write operation of retaining a group of positive holes, inside a channel semiconductor layer, generated by an impact ionization phenomenon by controlling voltages applied to first and second gate conductor layers and first and second impurity layers in each memory cell and a page erase operation of discharging the group of positive holes by controlling the voltages are performed. The first and second impurity layers and the first and second gate conductor layers of each memory cell is connected to a source line, a bit line connected to a sense amplifier circuit, a word line, and a driving control line respectively. In a page read operation, page data in a selected page is read to the bit lines. To the driving control line connected to a non-selected page, a voltage of zero volt or lower is applied.

10 Claims, 22 Drawing Sheets

(51) Int. Cl.
*G11C 16/24* (2006.01)
*H10B 12/00* (2023.01)

(58) Field of Classification Search
USPC .................................................. 365/189.011
See application file for complete search history.

(56) References Cited

U.S. PATENT DOCUMENTS

| | | | |
|---|---|---|---|
| 11,937,418 | B2 * | 3/2024 | Sakui .................. G11C 11/4091 |
| 11,990,204 | B2 * | 5/2024 | Sakui .................... H10B 12/30 |
| 2003/0111681 | A1 | 7/2003 | Kawanaka |
| 2006/0049444 | A1 | 3/2006 | Shino |
| 2008/0137394 | A1 | 6/2008 | Shimano et al. |
| 2008/0212366 | A1 | 9/2008 | Ohsawa |

FOREIGN PATENT DOCUMENTS

| | | |
|---|---|---|
| JP | 2006-080280 A | 3/2006 |
| JP | 3957774 B2 | 5/2007 |
| JP | 2008-218556 A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng, Y. He, G. Du, X. Liu and X. Zhang: "Experimental investigation of self heating effect (SHE) in multiple-fin SOI F inFETs," Semicond. Sci. Technol. 29 (2014) 115021 (7pp).

E. Yoshida, and T. Tanaka: "A Capacitorless 1T-DRAM Technology Using Gate- Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

Takashi Ohsawa: "SOI DRAM using single FET cell", Applied Physics, vol. 75, No. 9, pp. 1131-1135, 2006.

International Search Report (PCT/ISA/210) (Japanese) from PCT/JP2021/044837 dated Jan. 25, 2022, 3 pgs.

International Written Opinion (PCT/ISA/237) (Japanese) from PCT/JP2021/044837 dated Jan. 25, 2022, 3 pgs.

* cited by examiner

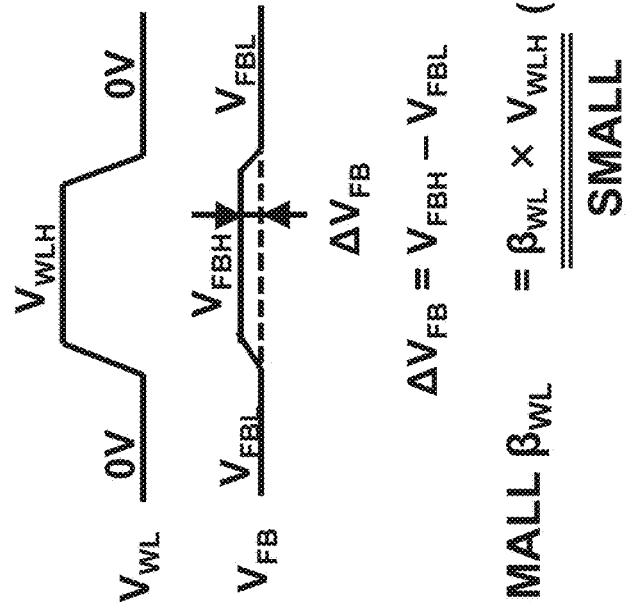

FIG. 2C

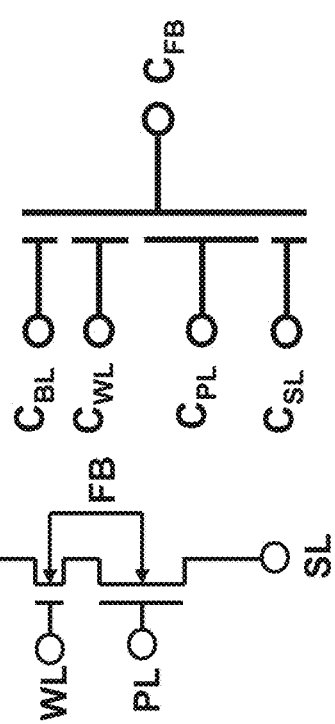

FIG. 2B

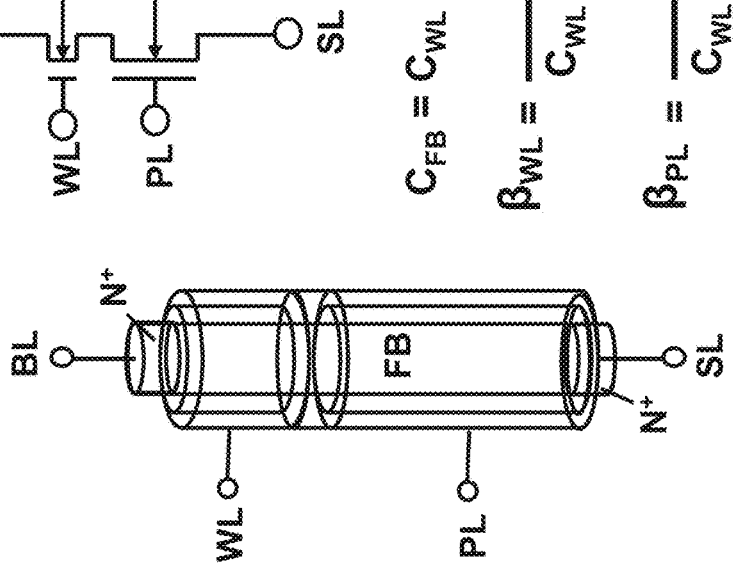

FIG. 2A $$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{SMALL } \beta_{WL}$$

$$\beta_{PL} = \frac{C_{PL}}{C_{WL} + C_{PL} + C_{BL} + C_{SL}} \quad (3) \Rightarrow \text{LARGE } \beta_{PL}$$

$$\beta_{BL} = \frac{C_{BL}}{C_{WL} + C_{PL} + C_{BL} + C_{SL}} \quad (4) \Rightarrow \text{SMALL } \beta_{BL}$$

$$\beta_{SL} = \frac{C_{SL}}{C_{WL} + C_{PL} + C_{BL} + C_{SL}} \quad (5) \Rightarrow \text{SMALL } \beta_{SL}$$

$$\Delta V_{FB} = V_{FBH} - V_{FBL} = \frac{\beta_{WL} \times V_{WLH}}{\text{SMALL}} \quad (6)$$

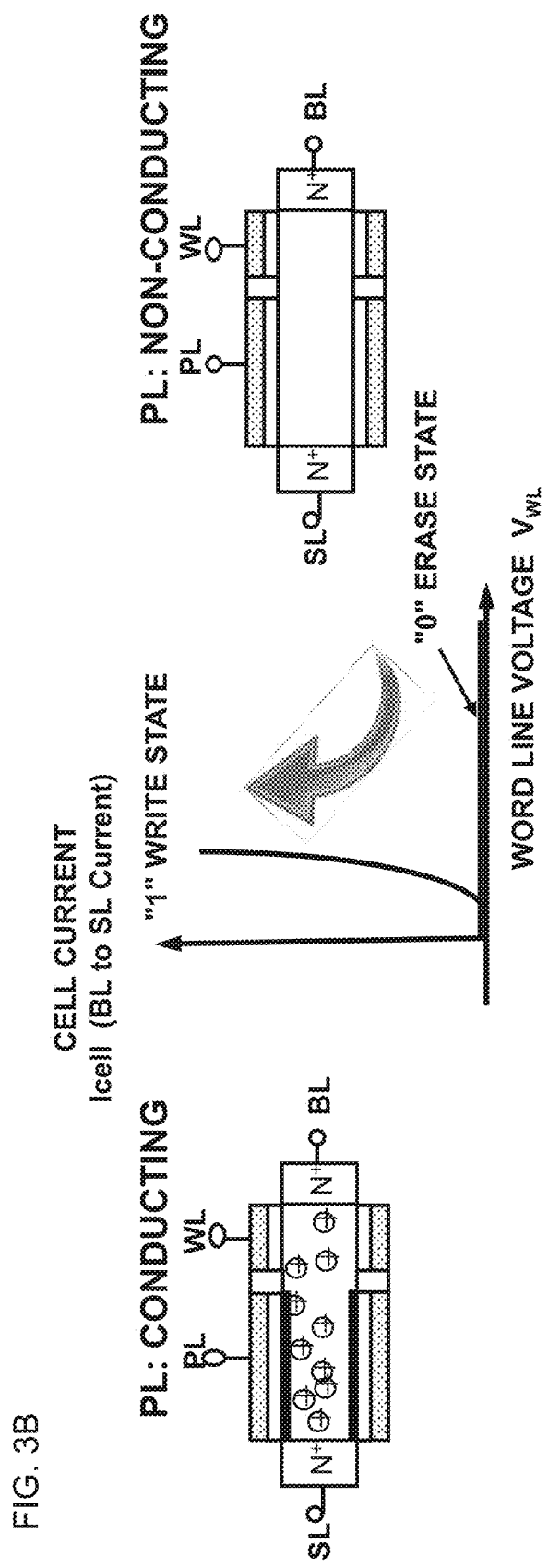

$V_{FB}\text{"1"} = Vb$  (7)
Vb: BUILT-IN VOLTAGE $V_{FB}\text{"0"} = Vb - \beta_{WL} \times V_{WLH} - \beta_{PL} \times (V_{PLH} - V_{PLL})$  (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$- \beta_{WL} \times Vt_{WL}\text{"1"} - \beta_{BL} \times V_{BLH}$  (9)

T3 - T4: FIRST PERIOD
T5 - T6: SECOND PERIOD
T9 - T10: THIRD PERIOD

Vb: Built-in Voltage 0.7V

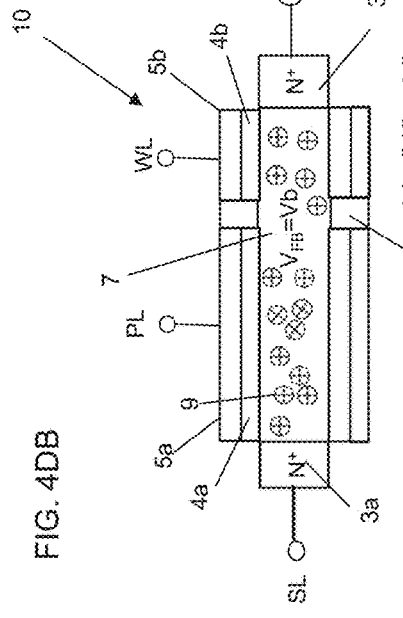

FIG. 4DA

T3 – T4: FIRST PERIOD
T5 – T6: SECOND PERIOD
T9 – T10: THIRD PERIOD

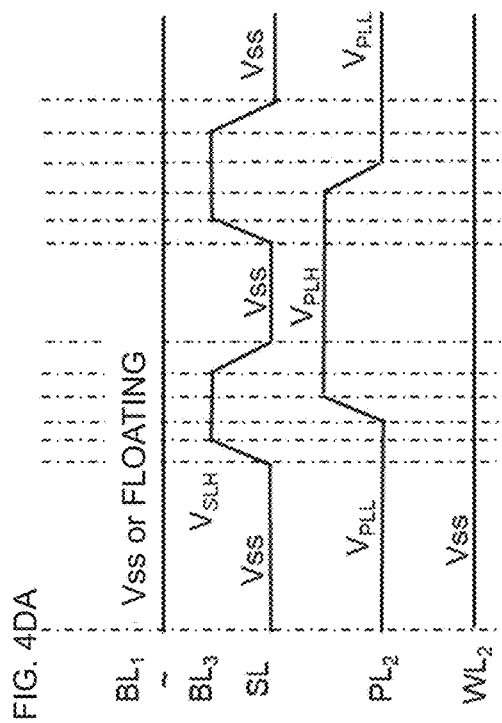

FIG. 4DC

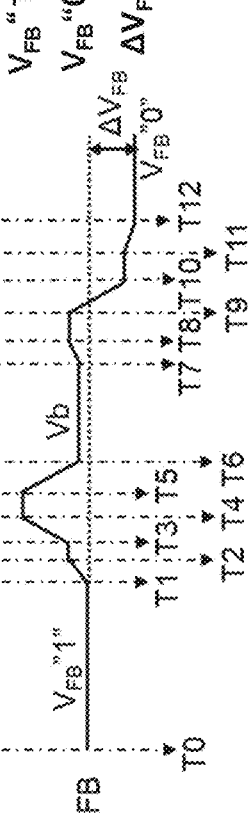

FIG. 4DB $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

Vb: BUILT-IN VOLTAGE

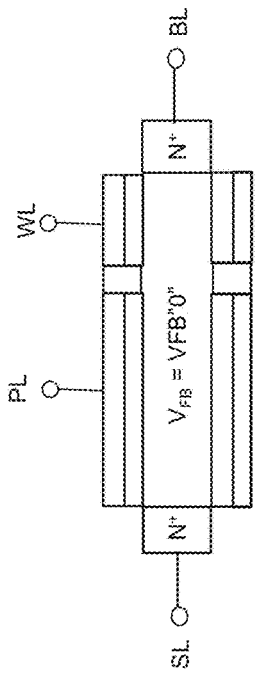

FIG. 4DD

Vb: Built-in Voltage 0.7V

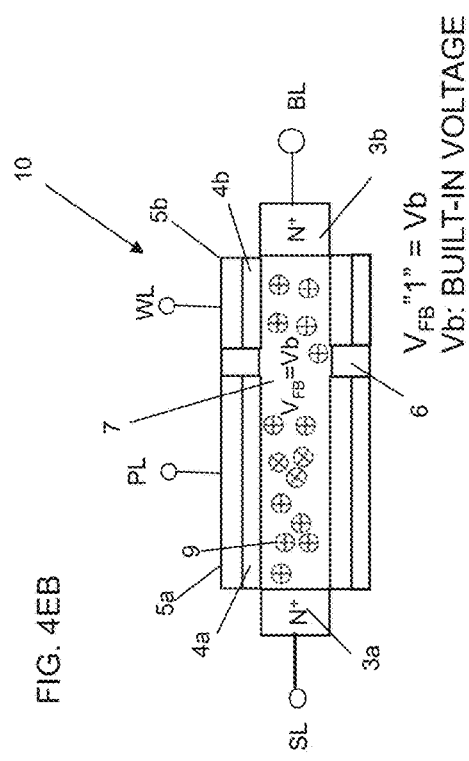

FIG. 4EA

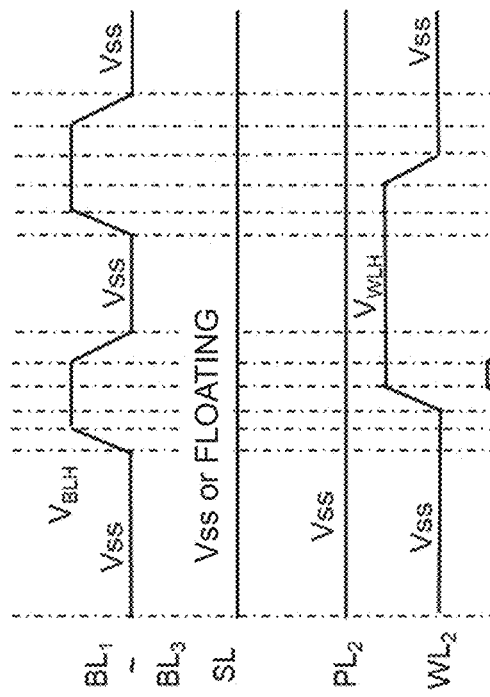

FIG. 4EB $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

Vb: BUILT-IN VOLTAGE

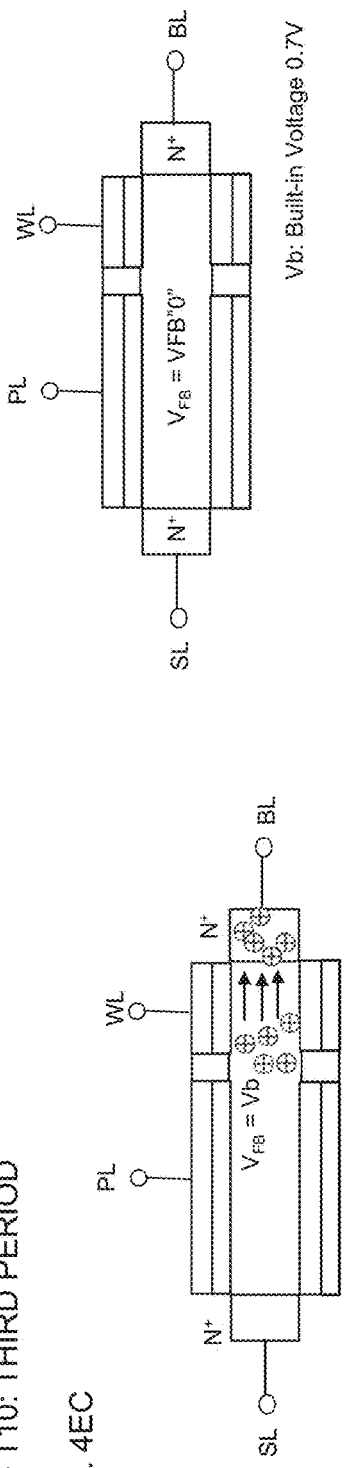

Vb: Built-in Voltage 0.7V

T3 - T4: FIRST PERIOD
T5 - T6: SECOND PERIOD
T9 - T10: THIRD PERIOD

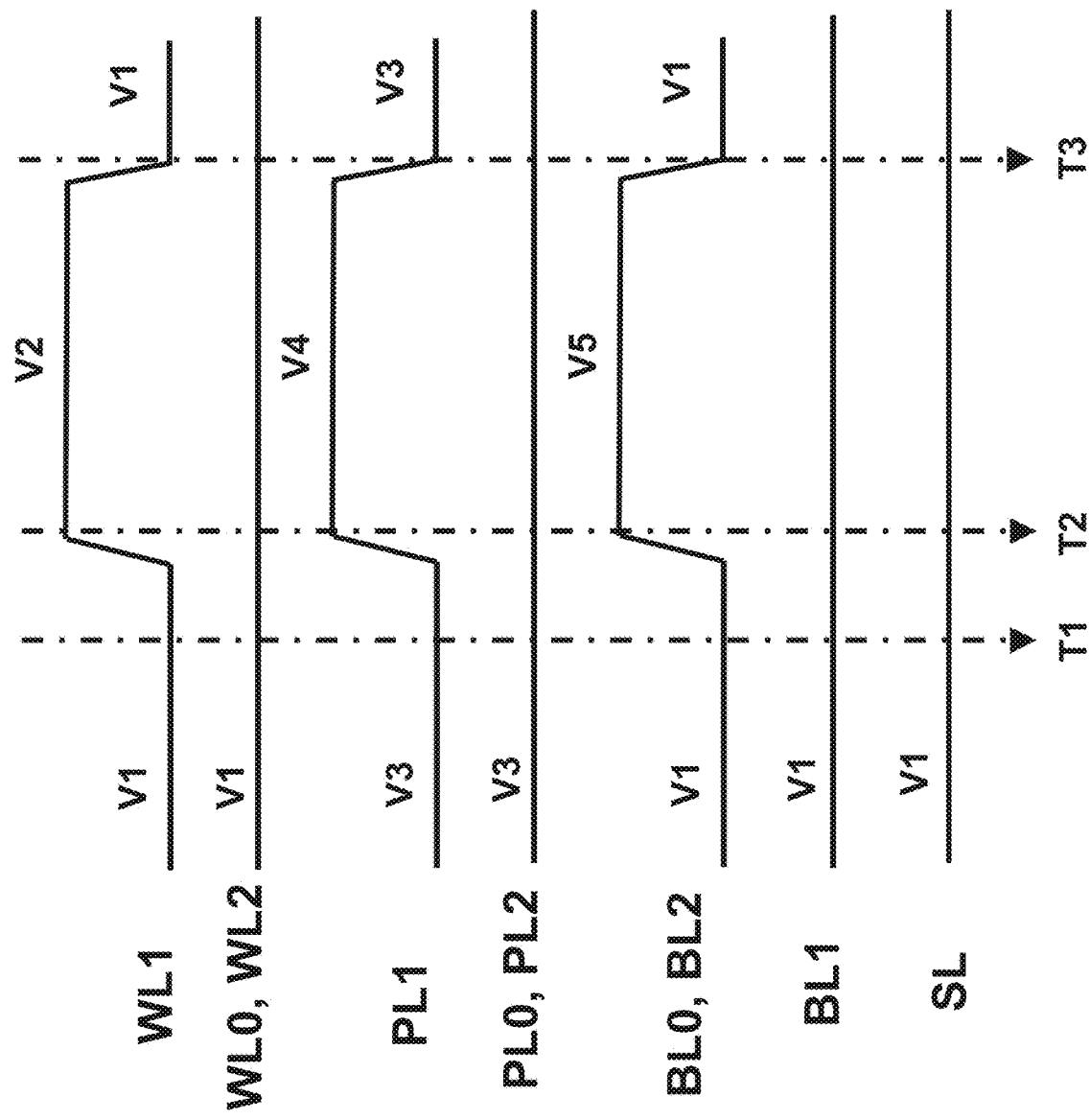

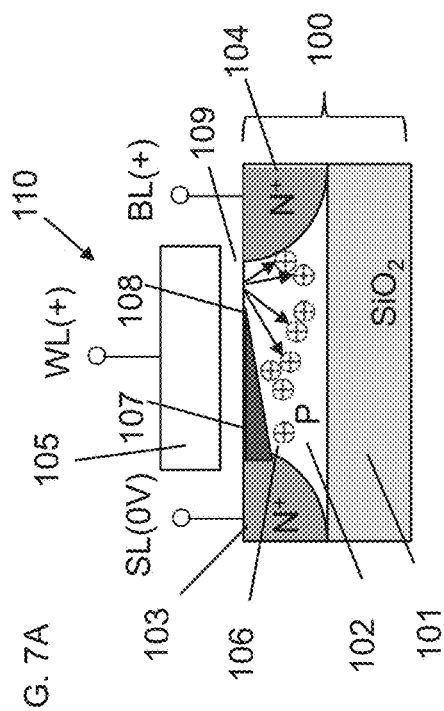
FIG. 7A
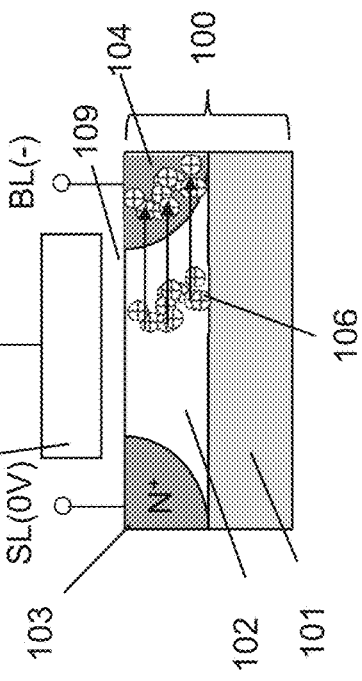
FIG. 7B
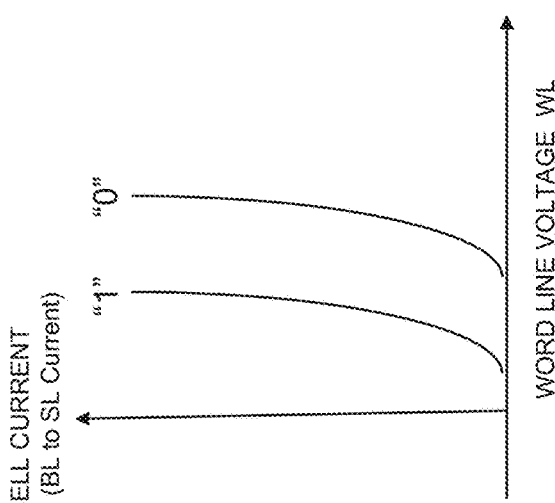
FIG. 7D
FIG. 7C $$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

SEMICONDUCTOR-ELEMENT-INCLUDING MEMORY DEVICE

CROSS REFERENCES TO RELATED APPLICATIONS

This application claims priority to PCT/JP2021/044837, filed Dec. 7, 2021, the entire content of which is incorporated herein by reference.

BACKGROUND OF THE INVENTION

1. Field of the Invention

The present invention relates to a semiconductor-element-including memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see, for example, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 7A to 7D illustrate a write operation of a DRAM memory cell constituted by a single MOS transistor and including no capacitor described above, FIGS. 8A and 8B illustrate a problem in the operation, and FIGS. 9A to 9C illustrate a read operation (see J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A design of a capacitorless 1T-DRAM cell using gate-induced drain leakage (GIDL) current for low-power and high-speed embedded memory", IEEE IEDM, pp. 913-916, December 2003). FIG. 7A illustrates a "1" write state. Here, the memory cell is formed on an SOI substrate 100, is constituted by a source $N^+$ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain N layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. Simultaneously, positive holes 106 are generated with which the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 7B illustrates a state in which the floating body 102 is charged to saturation with the generated positive holes 106.

Now, a "0" write operation of the memory cell 110 will be described with reference to FIG. 7C. For the common selected word line WL, the memory cell 110 to which "1" is written and the memory cell 110 to which "0" is written are present at random. FIG. 7C illustrates a state of rewriting from a "1" write state to a "0" write state. To write "0", the voltage of the bit line BL is set to a negative bias, and the PN junction between the drain N layer 104 and the P-layer floating body 102 is forward biased. As a result, the positive holes 106 in the floating body 102 generated in advance in the previous cycle flow into the drain N⁺ layer 104 that is connected to the bit line BL. When the write operation ends, the two memory cells are in a state in which the memory cell 110 (FIG. 7B) is filled with the generated positive holes 106, and from the memory cell 110 (FIG. 7C), the generated positive holes are discharged. The potential of the floating body 102 of the memory cell 110 filled with the positive holes 106 becomes higher than that of the floating body 102 in which generated positive holes are not present. Therefore, the threshold voltage for the memory cell 110 to which "1" is written becomes lower than the threshold voltage for the memory cell 110 to which "0" is written. This is illustrated in FIG. 7D.

Now, a problem in the operation of the memory cell constituted by the single MOS transistor 110 will be described with reference to FIGS. 8A and 8B. As illustrated in FIG. 8A, the capacitance $C_{FB}$ of the floating body is equal to the sum of the capacitance $C_{WL}$ between the gate to which the word line is connected and the floating body, the junction capacitance $C_{SL}$ of the PN junction between the source N⁺ layer 103 to which the source line is connected and the floating body 102, and the junction capacitance $C_{BL}$ of the PN junction between the drain N⁺ layer 104 to which the bit line is connected and the floating body 102 and is expressed as follows.

$$C_{FB} = C_{WL} + C_{BL} + C_{SL} \quad (10)$$

The capacitive coupling ratio $\beta_{WL}$ between the gate to which the word line is connected and the floating body is expressed as follows.

$$\beta_{WL} = C_{WL}/(C_{WL} + C_{BL} + C_{SL}) \quad (11)$$

Therefore, a change in the word line voltage $V_{WL}$ at the time of reading or writing affects the voltage of the floating body 102 that functions as a storage node (contact point) of the memory cell. This is illustrated in FIG. 8B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} \quad (12)$$
$$= \beta_{WL} \times V_{WLH}$$

Here, for $\beta_{WL}$ in expression (11), the contribution ratio of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which is a problem.

FIGS. 9A to 9C illustrate a read operation where FIG. 9A illustrates a "1" write state and FIG. 9B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 9C.

Therefore, there has been difficulty in commercially introducing DRAM memory cells actually including no capacitor.

T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002) and Takashi Osawa: "SOI DRAM using single FET cell", Applied Physics, Vol. 75, No. 9, pp. 1131-1135, 2006 describe a method for improving the retention property to retain "1" writing for an extended time by applying a negative voltage of −1.5 V to a non-selected word line WL. These documents also state that 1.8 V is applied to the bit line BL at the time of writing, and therefore, a voltage of 3.3 V is applied between the gate and the drain and storage data "0" is corrupted in a memory cell connected to the non-selected word line WL due to a gate-induced drain leakage current (GIDL current). FIG. 10 illustrates a part of a memory cell block of DRAM memory cells Cell_00 to Cell_11, in two rows and two columns, each constituted by a single MOS transistor. When a write operation starts in this memory cell block, one word line is selected from among non-selected word lines to which a negative voltage WL=−1.5 V is being applied, and a positive voltage WL=1.5 V is applied to the selected word line. To write "1" to the memory cell Cell_11, a positive voltage BL=1.8 V is applied to the bit line. At this time, to the memory cell Cell_01 that is a non-selected memory cell, WL=−1.5 V is applied as the gate voltage and BL=1.8 V is applied as the drain voltage. Therefore, to the gate of the non-selected memory cell Cell_01, −3.3 V, which is the potential difference from the drain, is applied consequently. As a result, a gate-induced drain leakage current (GIDL current) is generated in the non-selected memory cell Cell_01. When the storage data in the memory cell Cell_01 is "0", the storage data is corrupted.

In FIG. 10, to write "0" data to the memory cell Cell_10, a negative voltage BL=−0.7 V is applied to the bit line. WL=−1.5 V is being applied to the non-selected word line, and therefore, the floating body of the memory cell Cell_00 is lowered to a negative voltage due to capacitive coupling with the non-selected word line. Accordingly, even when "1" data is stored in the memory cell Cell_00, the PN junction between the drain and the floating body of the memory cell Cell_00 is not forward biased, and "1" data is not corrupted. As described above, although a negative voltage is applied to the non-selected word line in order to protect "1" data, a gate-induced drain leakage current (GIDL current) is consequently generated, and "0" data is corrupted, which is a big problem.

There exist memory elements in which a single memory cell is formed in an SOI (Silicon on Insulator) layer by using two MOS transistors (see, for example, US2008/0137394 A1 and US2003/0111681 A1, which are incorporated herein by these references). In these elements, an N⁺ layer that functions as the source or the drain and that separates the floating body channels of the two MOS transistors is formed so as to be in contact with an insulating layer. This N⁺ layer is in contact with the insulating layer, and therefore, the floating body channels of the two MOS transistors are electrically isolated from each other. Accordingly, the voltages of the floating body channels that are isolated from each other and in which a group of positive holes that are signal charges are accumulated also change to a large degree as expressed by expression (12) due to application of a pulse voltage to the gate electrode of each of the MOS transistors as described above. Accordingly, it is difficult to provide a sufficiently large margin to the potential difference between "1" and "0" at the time of writing, which is a problem.

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is transmitted to the floating body as noise, which is a problem. Further, with the technique for improving the retention property to retain "1" writing for an extended time by applying a negative voltage of −1.5 V to the non-selected word line WL, storage data "0" is corrupted in a memory cell connected to the non-selected word line WL due to a gate-induced drain leakage current (GIDL current), which is also a problem. These cause a problem of erroneous reading or erroneous rewriting of storage data and make it difficult to commercially introduce capacitor-less single-transistor DRAMs (gain cells).

To address the above-described problems, a semiconductor-element-including memory device according to an aspect of the present invention is a memory device,
 the memory device including a memory block constituted by a plurality of pages arranged in a column direction, each of the pages being constituted by a plurality of memory cells arranged in a row direction on a substrate,
 each of the memory cells included in each of the pages including:
 a semiconductor base material that stands on the substrate in a vertical direction or that extends along the substrate in a horizontal direction;
 a first impurity layer and a second impurity layer that are disposed at respective ends of the semiconductor base material;
 a first gate insulating layer that partially or entirely surrounds a side surface of the semiconductor base material between the first impurity layer and the second impurity layer and that is in contact with or in close vicinity to the first impurity layer;
 a second gate insulating layer that surrounds the side surface of the semiconductor base material, that is connected to the first gate insulating layer, and that is in contact with or in close vicinity to the second impurity layer;
 a first gate conductor layer that partially or entirely covers the first gate insulating layer;
 a second gate conductor layer that covers the second gate insulating layer; and
 a channel semiconductor layer that is the semiconductor base material and that is covered by the first gate insulating layer and the second gate insulating layer, in which the first impurity layer of each of the memory cells is connected to a source line, the second impurity layer thereof is connected to a corresponding one of bit lines, one of the first gate conductor layer or the second gate conductor layer thereof is connected to a corresponding one of word lines, the other of the first gate conductor layer or the second gate conductor layer thereof is connected to a corresponding one of driving control lines, and each of the bit lines is connected to a corresponding one of sense amplifier circuits,
 voltages applied to the first gate conductor layer, the second gate conductor layer, the first impurity layer, and the second impurity layer are controlled to retain a group of positive holes, inside the channel semiconductor layer, generated by an impact ionization phenomenon,
 in a page write operation, a voltage of the channel semiconductor layer is made equal to a first data retention voltage that is higher than the voltage of either the first impurity layer or the second impurity layer or that is higher than the voltages of both the first impurity layer and the second impurity layer,
 in a page erase operation, the voltages applied to the first impurity layer, the second impurity layer, the first gate conductor layer, and the second gate conductor layer are controlled to discharge the group of positive holes through either the first impurity layer or the second impurity layer or both the first impurity layer and the second impurity layer, and subsequently, the voltage of the channel semiconductor layer is made equal to a second data retention voltage that is lower than the first data retention voltage by capacitive coupling between the first gate conductor layer and the channel semiconductor layer and capacitive coupling between the second gate conductor layer and the channel semiconductor layer,
 in a page read operation, page data of a group of memory cells in at least one selected page among the pages is read to the bit lines, and
 to a driving control line, among the driving control lines, connected to memory cells in a non-selected page among the pages, a voltage lower than or equal to zero volt is applied while the memory device is operating (first invention).

In the first invention described above, in the page read operation, in the page write operation, and in the page erase operation, a voltage lower than or equal to zero volt is applied to a non-selected driving control line among the driving control lines (second invention).

In the first invention described above, in the page read operation, to a driving control line, among the driving control lines, connected to memory cells in a selected page among the pages, a voltage higher than or equal to a ground voltage is applied (third invention).

In the first invention described above, in the page read operation, a refresh operation of returning the voltage of the channel semiconductor layer in a selected page among the pages to the first data retention voltage by the group of positive holes generated, inside the channel semiconductor layer in the selected page, by an impact ionization phenomenon is performed (fourth invention).

In the first invention described above, as the driving control lines of the memory cells arranged in the row direction and in the column direction, a driving control line is disposed so as to be shared among the memory cells adjacent to each other (fifth invention).

In the first invention described above, a first gate capacitance between the first gate conductor layer and the channel semiconductor layer is larger than a second gate capacitance between the second gate conductor layer and the channel semiconductor layer (sixth invention).

In the first invention described above, the first gate conductor layer is isolated into at least two conductor layers around the first gate insulating layer when viewed in an axial direction of the semiconductor base material (seventh invention).

In the first invention described above, a first pulse width of the word lines and the bit lines in a refresh operation is longer than a second pulse width of the word lines and the bit lines in the page read operation (eighth invention).

In the first invention described above, the impact ionization phenomenon occurs inside the channel semiconductor layer in proximity to a part between the first gate conductor layer and the second gate conductor layer and generates the group of positive holes inside the channel semiconductor layer (ninth invention).

In the first invention described above, in a page sum-of-products read operation of selecting at least two pages in multiple selection, a voltage higher than or equal to a ground voltage is applied to a selected driving control line among the driving control lines, and a negative voltage is applied to a non-selected driving control line among the driving control lines (tenth invention).

BRIEF DESCRIPTION OF THE DRAWINGS

FIGS. 2A, 2B and 2C are diagrams for explaining an effect attained in a case where the gate capacitance of a first gate conductor layer connected to a plate line is made larger than the gate capacitance of a second gate conductor layer to which a word line is connected in the SGT-including memory device according to the first embodiment;

FIG. 3B includes diagrams for explaining the mechanism of the write operation of the SGT-including memory device according to the first embodiment;

FIGS. 4DA, 4DB, 4DC and 4DD are diagrams for explaining a mechanism of the page erase operation of the SGT-including memory device according to the first embodiment;

FIGS. 4EA, 4EB, 4EC and 4ED are diagrams for explaining a mechanism of the page erase operation of the SGT-including memory device according to the first embodiment;

FIG. 6B is an operation waveform diagram for explaining the operation of setting a plate line of a non-selected page of the SGT-including memory device according to the first embodiment at a negative voltage;

FIGS. 7A, 7B, 7C and 7D are diagrams for explaining a write operation of a DRAM memory cell including no capacitor in the related art;

DESCRIPTION OF THE PREFERRED EMBODIMENTS

Hereinafter, a semiconductor-element-including memory device (hereinafter called a dynamic flash memory) according to embodiments of the present invention will be described with reference to the drawings.

First Embodiment

The structure and operation mechanisms of a dynamic flash memory cell according to a first embodiment of the present invention will be described with reference to FIG. 1 to FIGS. 5A to 5C. The structure of the dynamic flash memory cell will be described with reference to FIG. 1. An effect attained in a case where the gate capacitance of a first gate conductor layer $5a$ connected to a plate line PL is made larger than the gate capacitance of a second gate conductor layer $5b$ to which a word line WL is connected will be described with reference to FIGS. 2A to 2C. A mechanism of a data write operation will be described with reference to FIGS. 3AA to 3AC and FIG. 3B, mechanisms of a data erase operation will be described with reference to FIG. 4A to FIGS. 4EA to 4ED, and a mechanism of a data read operation will be described with reference to FIGS. 5A to 5C.

Figure 1:
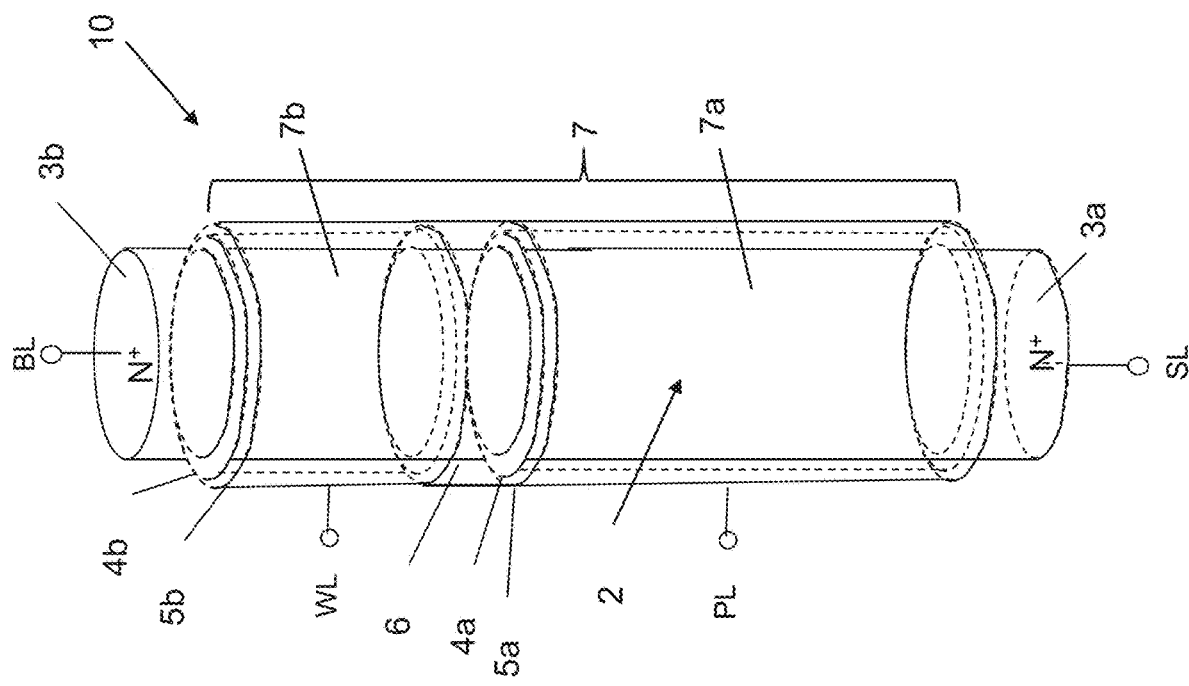
FIG. 1 is a structural diagram of an SGT-including memory device according to a first embodiment.

FIG. 1 illustrates the structure of the dynamic flash memory cell according to the first embodiment of the present invention. On the top and the bottom of a silicon semiconductor pillar 2 (the silicon semiconductor pillar is hereinafter referred to as "Si pillar") (which is an example of "semiconductor base material" in the claims) of the P or i (intrinsic) conductivity type formed on a substrate, N$^+$ layers 3a and 3b (which are examples of "first impurity layer" and "second impurity layer" in the claims), one of which functions as the source and the other functions as the drain, are formed respectively. The part of the Si pillar 2 between the N$^+$ layers 3a and 3b that function as the source and the drain functions as a channel region 7 (which is an example of "channel semiconductor layer" in the claims). Around the channel region 7, a first gate insulating layer 4a (which is an example of "first gate insulating layer" in the claims) and a second gate insulating layer 4b (which is an example of "second gate insulating layer" in the claims) are formed. The first gate insulating layer 4a and the second gate insulating layer 4b are in contact with or in close vicinity to the N$^+$ layers 3a and 3b that function as the source and the drain respectively. Around the first gate insulating layer 4a and the second gate insulating layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer"). The channel region 7 between the NW layers 3a and 3b is constituted by a first channel Si layer 7a surrounded by the first gate insulating layer 4a and a second channel Si layer 7b surrounded by the second gate insulating layer 4b. Accordingly, the N$^+$ layers 3a and 3b that function as the source and the drain, the channel region 7, the first gate insulating layer 4a, the second gate insulating layer 4b, the first gate conductor layer 5a, and the second gate conductor layer 5b constitute a dynamic flash memory cell 10. The N$^+$ layer 3a that functions as the source is connected to a source line SL (which is an example of "source line" in the claims), the N$^+$ layer 3b that functions as the drain is connected to a bit line BL (which is an example of "bit line" in the claims), the first gate conductor layer 5a is connected to the plate line PL (which is an example of "driving control line" in the claims), and the second gate conductor layer 5b is connected to the word line WL (which is an example of "word line" in the claims). Desirably, the structure is such that the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulating layers may be made different such that the thickness of the gate insulating film of the first gate insulating layer 4a is thinner than the thickness of the gate insulating film of the second gate insulating layer 4b. Alternatively, the dielectric constants of the materials of the respective gate insulating layers may be made different such that the dielectric constant of the gate insulating film of the first gate insulating layer 4a is higher than the dielectric constant of the gate insulating film of the second gate insulating layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulating layers 4a and 4b.

FIGS. 2A to 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the channel region 7 is determined by the voltage states of the lines.

FIG. 2B is a diagram for explaining the capacitance relationships of the respective lines. The capacitance $C_{FB}$ of the channel region 7 is equal to the sum of the capacitance $C_{WL}$ between the gate conductor layer 5b to which the word line WL is connected and the channel region 7, the capacitance $C_{PL}$ between the gate conductor layer 5a to which the plate line PL is connected and the channel region 7, the junction capacitance $C_{SL}$ of the PN junction between the source N$^+$ layer 3a to which the source line SL is connected and the channel region 7, and the junction capacitance $C_{BL}$ of the PN junction between the drain N$^+$ layer 3b to which the bit line BL is connected and the channel region 7, and is expressed as follows.

$$C_{FB}=C_{WL}+C_{PL}+C_{BL}+C_{SL} \quad (1)$$

Therefore, the coupling ratio $\beta_{WL}$ between the word line WL and the channel region 7, the coupling ratio $\beta_{PL}$ between the plate line PL and the channel region 7, the coupling ratio $\beta_{BL}$ between the bit line BL and the channel region 7, and the coupling ratio $\beta_{SL}$ between the source line SL and the channel region 7 are expressed as follows.

$$\beta_{WL}=C_{WL}/(C_{WL}+C_{PL}+C_{BL}+C_{SL}) \quad (2)$$

$$\beta_{PL}=C_{PL}(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL}>C_{WL}$ holds, and therefore, this results in $\beta_{PL}>\beta_{WL}$.

FIG. 2C is a diagram for explaining a change in the voltage $V_{FB}$ of the channel region 7 when the voltage $V_{WL}$ of the word line WL rises at the time of a read operation or a write operation and subsequently drops. Here, the potential difference $\Delta V_{FB}$ when the voltage $V_{FB}$ of the channel region 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\Delta V_{FB} = V_{FBH} - V_{FBL} \quad (6)$$

$$= \beta_{WL} \times V_{WLH}$$

The coupling ratio $\beta_{WL}$ between the word line WL and the channel region 7 is small and the coupling ratio $\beta_{PL}$ between the plate line PL and the channel region 7 is large, and therefore, $\Delta V_{FB}$ is small, and the voltage $V_3$ of the channel region 7 negligibly changes even when the voltage $V_{WL}$ of the word line WL changes at the time of a read operation or a write operation.

Figure 3A:
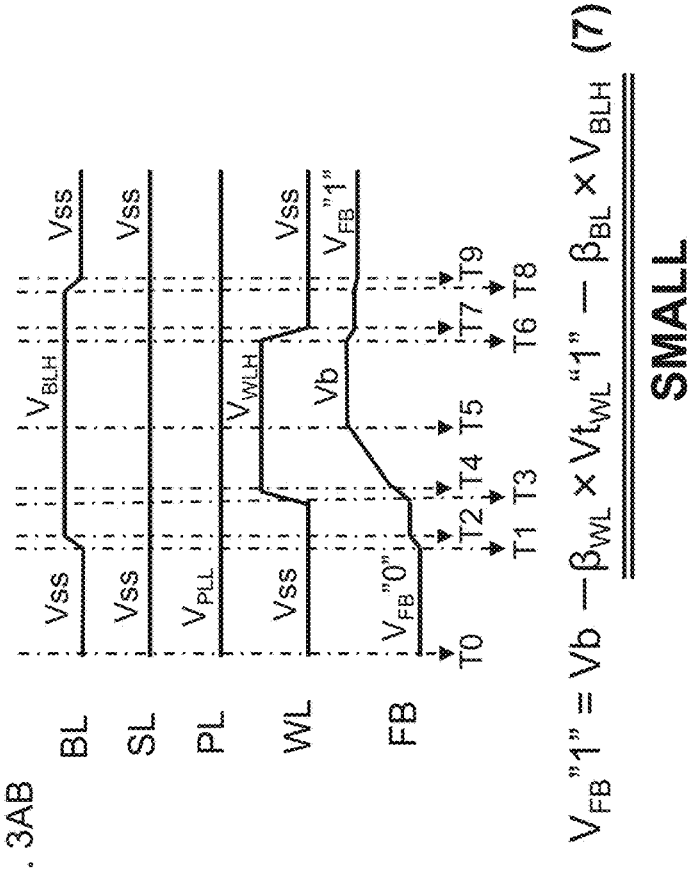
FIGS. 3AA, 3AB and 3AC are diagrams for explaining a mechanism of a write operation of the SGT-including memory device according to the first embodiment.
Figure 3A:
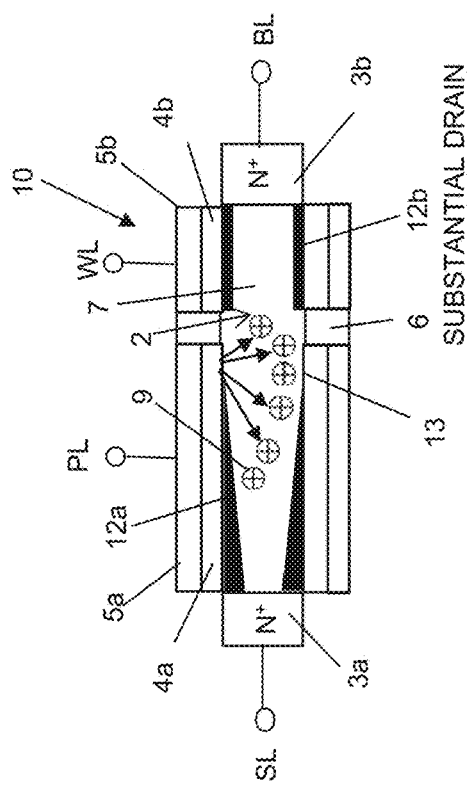
Figure 3A:
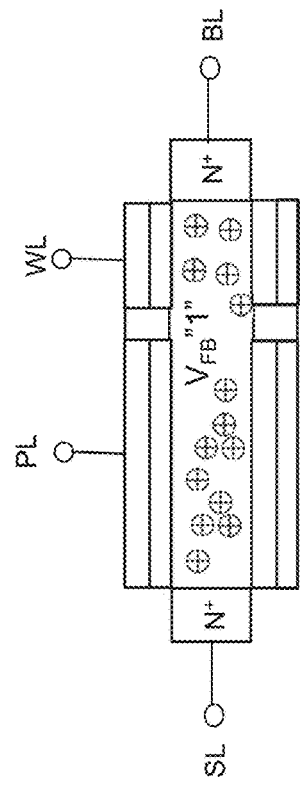

FIGS. 3AA to 3AC and FIG. 3B illustrate a memory write operation (which is an example of "page write operation" in the claims) of the dynamic flash memory cell according to the first embodiment of the present invention. FIG. 3AA illustrates a mechanism of the write operation, and FIG. 3AB illustrates operation waveforms of the bit line BL, the source line SL, the plate line PL, the word line WL, and the channel region 7 that functions as a floating body FB. At time T0, the dynamic flash memory cell is in a "0" erase state, and the voltage of the channel region 7 is equal to $V_{FB}$"0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vss to $V_{BL}H$, in a case where, for example, Vss is equal to 0 V, the voltage of the channel region 7 becomes equal to $V_{FB}$"0"+$\beta_{BL} \times V_{BLH}$ due to capacitive coupling between the bit line BL and the channel region 7.

The description of the write operation of the dynamic flash memory cell will be continued with reference to FIGS. 3AA and 3AB. From time T3 to time T4, the word line WL rises from Vss to $V_{WLH}$. Accordingly, when the threshold voltage for "0" erase for a second N-channel MOS transistor region that is a region in which the second gate conductor layer 5b to which the word line WL is connected surrounds the channel region 7 is denoted by $Vt_{WL}$"0", as the voltage of the word line WL rises, in a range from Vss to $Vt_{WL}$"0", the voltage of the channel region 7 becomes equal to $V_{FB}$"0"+$\beta_{BL} \times V_{BLH}$+$\beta_{WL} \times Vt_{WL}$"0" due to second capacitive coupling between the word line WL and the channel region 7. When the voltage of the word line WL rises to $Vt_{WL}$"0" or above, an inversion layer 12b in a ring form is formed in the channel region 7 on the inner periphery of the second gate conductor layer 5b and interrupts the second capacitive coupling between the word line WL and the channel region 7.

The description of the write operation of the dynamic flash memory cell will be continued with reference to FIGS. 3AA and 3AB. From time T3 to time T4, for example, a fixed voltage $V_{PLL}$=2 V is applied to the first gate conductor layer 5a to which the plate line PL is connected, and the second gate conductor layer 5b to which the word line WL is connected is increased to, for example, $V_{WLH}$=4 V. As a result, as illustrated in FIG. 3AA, an inversion layer 12a in a ring form is formed in the channel region 7 on the inner periphery of the first gate conductor layer 5a to which the plate line PL is connected, and a pinch-off point 13 is present in the inversion layer 12a. As a result, a first N-channel MOS transistor region including the first gate conductor layer 5a operates in the saturation region. In contrast, the second N-channel MOS transistor region including the second gate conductor layer 5b to which the word line WL is connected operates in the linear region. As a result, a pinch-off point is not present in the channel region 7 on the inner periphery of the second gate conductor layer 5b to which the word line WL is connected, and the inversion layer 12b is formed on the entire inner periphery of the gate conductor layer 5b. The inversion layer 12b that is formed on the entire inner periphery of the second gate conductor layer 5b to which the word line WL is connected substantially functions as the drain of the second N-channel MOS transistor region including the second gate conductor layer 5b. As a result, the electric field becomes maximum in a first boundary region of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the $N^+$ layer 3a to which the source line SL is connected toward the $N^+$ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the $N^+$ layer 3b to which the bit line BL is connected (not illustrated).

As illustrated in FIG. 3AC, a generated group of positive holes 9 (which is an example of "group of positive holes" in the claims) are majority carriers in the channel region 7, with which the channel region 7 is charged to a positive bias. The $N^+$ layer 3a to which the source line SL is connected is at 0 V, and therefore, the channel region 7 is charged up to the built-in voltage Vb (about 0.7 V) of the PN junction between the $N^+$ layer 3a to which the source line SL is connected and the channel region 7. When the channel region 7 is charged to a positive bias, the threshold voltages for the first N-channel MOS transistor region and the second N-channel MOS transistor region decrease due to a substrate bias effect.

The description of the write operation of the dynamic flash memory cell will be continued with reference to FIG. 3AB. From time T6 to time T7, the voltage of the word line WL drops from $V_{WLH}$ to Vss. During this period, although the second capacitive coupling is formed between the word line WL and the channel region 7, the inversion layer 12b interrupts the second capacitive coupling until the voltage of the word line WL drops from $V_{WLH}$ to a threshold voltage $Vt_{WL}$"1" for the second N-channel MOS transistor region or below when the voltage of the channel region 7 is equal to Vb. Therefore, the capacitive coupling between the word line WL and the channel region 7 is substantially formed only during a period from when the word line WL drops to $Vt_{WL}$"1" or below to when the word line WL drops to Vss. As a result, the voltage of the channel region 7 becomes equal to Vb−$\beta_{WL} \times Vt_{WL}$"1". Here, $Vt_{WL}$"1" is lower than $Vt_{WL}$"0" described above, and $\beta_{WL} \times Vt_{WL}$"1" is small.

The description of the write operation of the dynamic flash memory cell will be continued with reference to FIG. 3AB. From time T8 to time T9, the bit line BL drops from $V_{BLH}$ to Vss. The bit line BL and the channel region 7 are capacitively coupled with each other, and therefore, the "1" write voltage $V_{31}$"1" of the channel region 7 becomes as follows at the end.

$$V_{FB}\text{"1"}=Vb-\beta_{WL}\times Vt_{WL}\text{"1"}-\beta_{BL}\times V_{BLH} \quad (7)$$

Here, the coupling ratio $\beta_{BL}$ between the bit line BL and the channel region 7 is also small. Accordingly, as illustrated in FIG. 3B, the threshold voltage for the second N-channel MOS transistor region of the second channel region 7b to which the word line WL is connected decreases. The memory write operation in which the voltage $V_{FB}$"1" in the "1" write state of the channel region 7 is assumed to be a first data retention voltage (which is an example of "first data retention voltage" in the claims) is performed to assign logical storage data "1".

At the time of the write operation, electron-positive hole pairs may be generated by an impact ionization phenomenon in a second boundary region between the first impurity layer 3a and the first channel region 7a or in a third boundary region between the second impurity layer 3b and the second channel region 7b instead of the first boundary region, and the channel region 7 may be charged with the generated group of positive holes 9.

Note that the conditions of voltages applied to the bit line BL, the source line SL, the word line WL, and the plate line PL and the potential of the floating body described above are examples for performing the write operation, and other operation conditions based on which the write operation can be performed may be employed.

Mechanisms of a memory erase operation (which is an example of "page erase operation" in the claims) will be described with reference to FIG. 4A to FIGS. 4EA to 4ED.

Figure 4A:
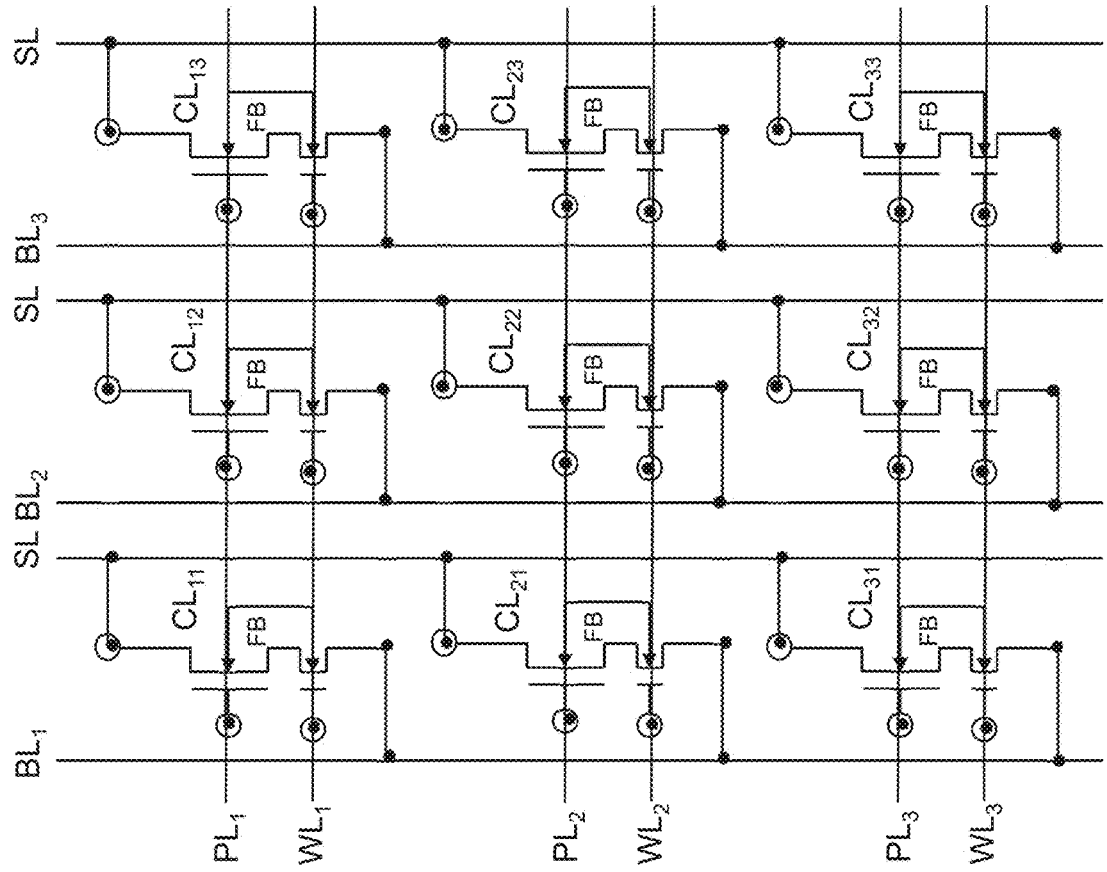
FIG. 4A is a diagram for explaining a mechanism of a page erase operation of the SGT-including memory device according to the first embodiment.

FIG. 4A is a memory block circuit diagram for explaining a page erase operation. Although nine memory cells $CL_{11}$ to $CL_{33}$ in three rows and three columns are illustrated, the actual memory block is larger than this matrix. When memory cells are arranged in a matrix, one of the directions of the arrangement is called a row direction (or in rows) and the direction perpendicular to the one of the directions is called "column direction" (or in columns). To each of the memory cells, the source line SL, a corresponding one of the bit lines $BL_1$ to $BL_3$, a corresponding one of the plate lines $PL_1$ to $PL_3$, and a corresponding one of the word lines $WL_1$ to $WL_3$ are connected. For example, it is assumed that the memory cells $CL_{21}$ to $CL_{23}$, in a certain page (which is an example of "page" in the claims), to which the plate line $PL_2$ and the word line $WL_2$ are connected are selected in this block and a page erase operation is performed.

Figure 4B:
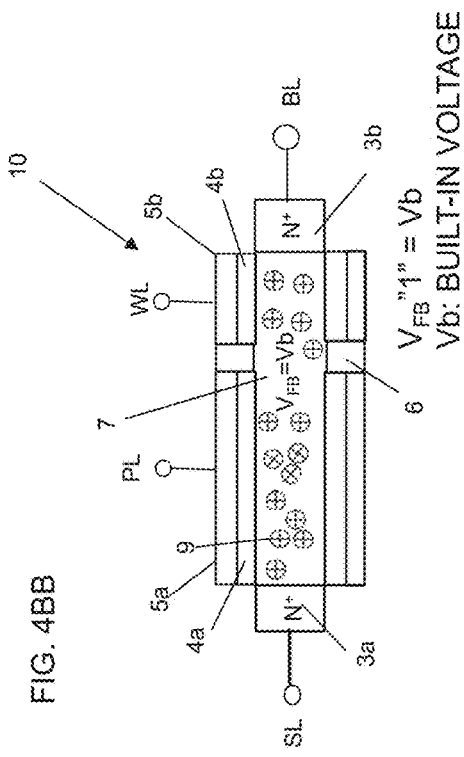
FIGS. 4BA, 4BB, 4BC and 4BD are diagrams for explaining the mechanism of the page erase operation of the SGT-including memory device according to the first embodiment.
Figure 4B:
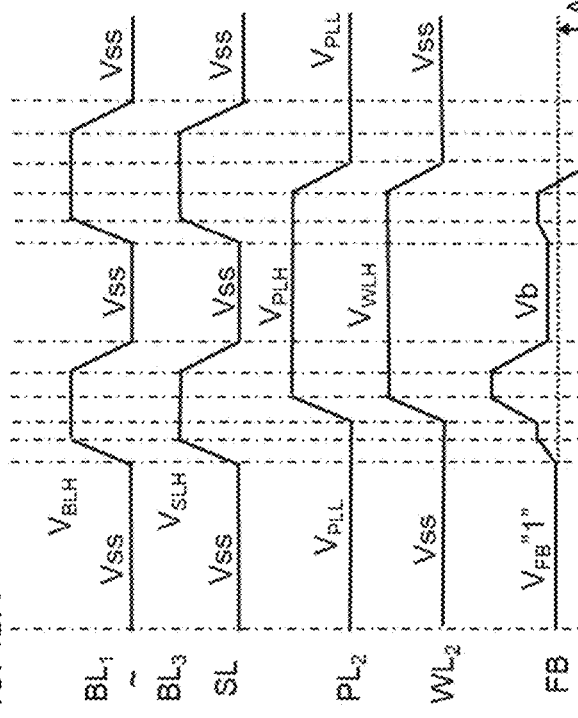
Figure 4B:
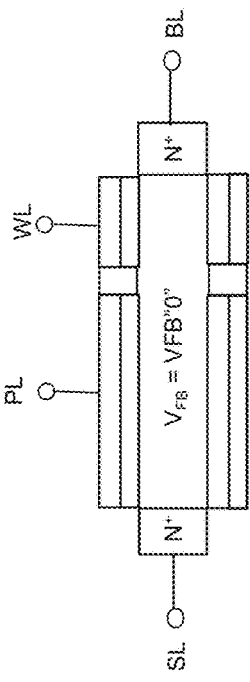
Figure 4B:
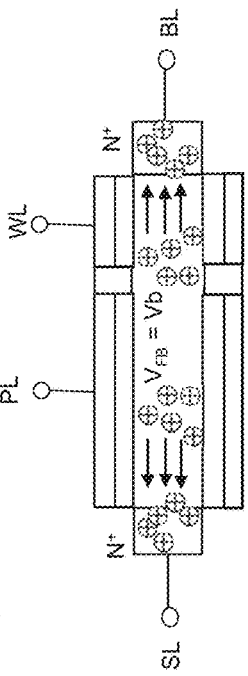

A mechanism of the page erase operation will be described with reference to FIGS. 4BA to 4BD and FIG. 4C. Here, the channel region 7 between the $N^+$ layers 3a and 3b is electrically isolated from the substrate and functions as a floating body. FIG. 4BA is a timing operation waveform diagram of main nodes in the erase operation. In FIG. 4BA, T0 to T12 indicate times from the start to the end of the erase operation. FIG. 4BB illustrates a state at time T0 before the erase operation, in which the group of positive holes 9 generated by an impact ionization phenomenon in the previous cycle are accumulated in the channel region 7. From time T1 to time T2, the bit lines $BL_1$ to $BL_3$ and the source line SL rise from Vss to $V_{BLH}$ and $V_{SLH}$ respectively and are in a high-voltage state. Here, Vss is, for example, equal to 0 V. With this operation, subsequently, from T3 to T4, the plate line $PL_2$ selected in the page erase operation rises from a first voltage $V_{PLL}$ to a second voltage $V_{PLH}$ and is in a high-voltage state, the word line $WL_2$ selected in the page erase operation rises from a third voltage Vss to a fourth voltage $V_{WL}$, and is in a high-voltage state, and this prevents the inversion layer 12a on the inner periphery of the first gate conductor layer 5a to which the plate line $PL_2$ is connected and the inversion layer 12b on the inner periphery of the second gate conductor layer 5b to which the word line $WL_2$ is connected from being formed in the channel region 7. Therefore, when the threshold voltage for the second N-channel MOS transistor region on the side of the word line $WL_2$ and the threshold voltage for the first N-channel MOS transistor region on the side of the plate line $PL_2$ are denoted by $Vt_{WL}$ and $V_{tPL}$ respectively, it is desirable that the voltages $V_{BLH}$ and $V_{SLH}$ satisfy $V_{BLH}>V_{WLH}+V_{tWL}$ and $V_{SLH}>V_{PLH}+V_{tPL}$. For example, in a case where $V_{tWL}$ and $V_{tPL}$ are equal to 0.5 V, $V_{WLH}$ and $V_{PLH}$ need to be set to 3 V, and $V_{BLH}$ and $V_{SLH}$ need to be set to 3.5 V or higher.

The description of the mechanism of the page erase operation illustrated in FIG. 4BA will be continued. As the plate line $PL_2$ and the word line $WL_2$ respectively rise to the second voltage $V_{PLH}$ and the fourth voltage $V_{WLH}$ and are in a high-voltage state during the period from T3 to T4, the voltage of the channel region 7 in a floating state is increased due to first capacitive coupling between the plate line $PL_2$ and the channel region 7 and second capacitive coupling between the word line $WL_2$ and the channel region 7. The voltage of the channel region 7 rises from $V_{FB}$"1" in the "1" write state to a high voltage. This voltage rise is possible because the voltage of the bit lines $BL_1$ to $BL_3$ and that of the source line SL are high voltages of $V_{BLH}$ and $V_{SLH}$ respectively and the PN junction between the source $N^+$ layer 3a and the channel region 7 and the PN junction between the drain $N^+$ layer 3b and the channel region 7 are in a reverse bias state accordingly.

The description of the mechanism of the page erase operation illustrated in FIG. 4BA will be continued. During the subsequent period from T5 to T6, the voltage of the bit lines $BL_1$ to $BL_3$ and that of the source line SL respectively drop from high voltages of $V_{3L}$ and $V_{SLH}$ to Vss. As a result, the PN junction between the source $N^+$ layer 3a and the channel region 7 and the PN junction between the drain $N^+$ layer 3b and the channel region 7 are in a forward bias state as illustrated in FIG. 4BC, and a remaining group of positive holes among the group of positive holes 9 in the channel region 7 are discharged to the source $N^+$ layer 3a and to the drain $N^+$ layer 3b. As a result, the voltage $V_{FB}$ of the channel region 7 becomes equal to the built-in voltage Vb of the PN junction formed by the source $N^+$ layer 3a and the P-layer channel region 7 and the PN junction formed by the drain $N^+$ layer 3b and the P-layer channel region 7.

The description of the mechanism of the page erase operation illustrated in FIG. 4BA will be continued. Subsequently, from T7 to T8, the voltage of the bit lines $BL_1$ to $BL_3$ and that of the source line SL rise from Vss to high voltages of $V_{BLH}$ and $V_{SLH}$ respectively. With this operation, as illustrated in FIG. 4BD, when the plate line $PL_2$ drops from the second voltage $V_{PLH}$ to the first voltage $V_{PLL}$ and the word line $WL_2$ drops from the fourth voltage $V_{WLH}$ to the third voltage Vss, from T9 to T10, the voltage $V_{FB}$ of the channel region 7 efficiently changes from Vb to $V_{FB}$"0" due to the first capacitive coupling between the plate line $PL_2$ and the channel region 7 and the second capacitive coupling between the word line $WL_2$ and the channel region 7 without the inversion layer 12a on the side of the plate line $PL_2$ or the inversion layer 12b on the side of the word line $WL_2$ being formed in the channel region 7. The voltage difference $\Delta V_{FB}$ of the channel region 7 between the "1" write state and the "0" erase state is expressed by the following expressions.

$$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0" = \quad (9)$$

$$\beta_{WL} \times V_{WLH} + \beta_{PL} \times (V_{PLH} - V_{PLL}) - \beta_{WL} \times Vt_{WL}"1" - \beta_{BL} \times V_{BLH}$$

Here, the sum of $\beta_{WL}$ and $\beta_{PL}$ is greater than or equal to 0.8, $\Delta V_{FB}$ is large, and a sufficient margin is provided.

Figure 4C:
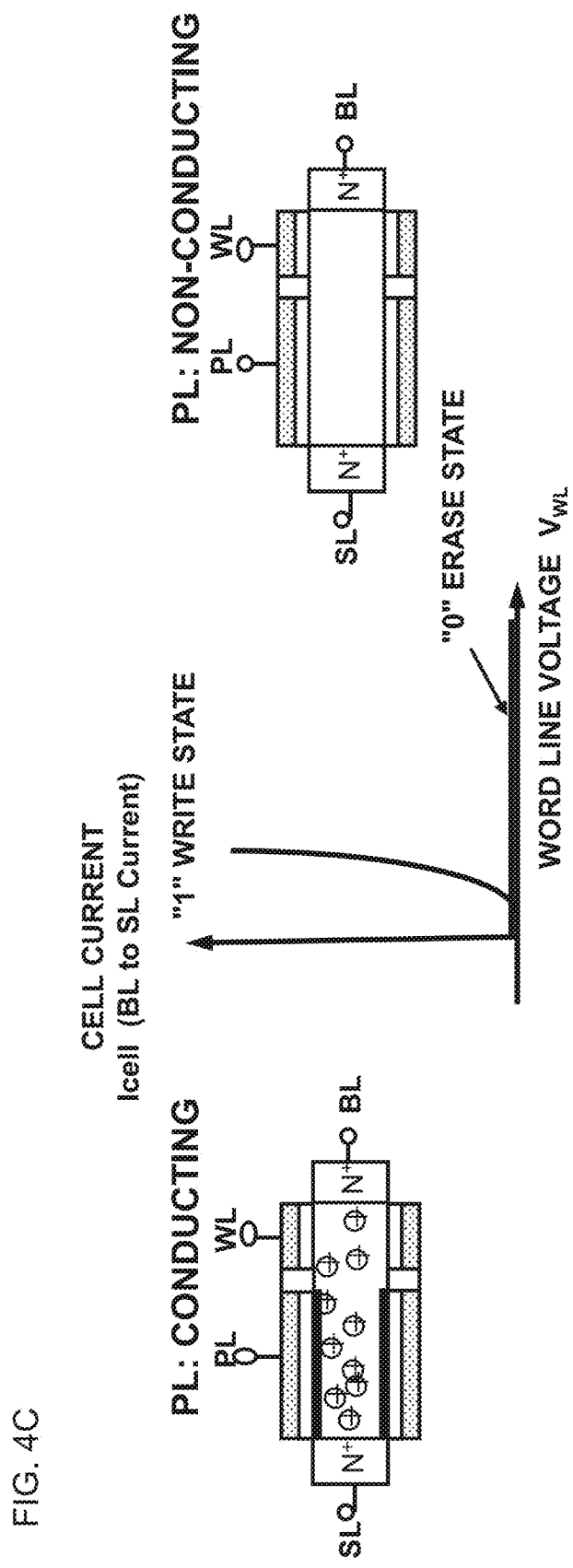
FIG. 4C includes diagrams for explaining the mechanism of the page erase operation of the SGT-including memory device according to the first embodiment.

As a result, as illustrated in FIG. 4C, a large margin is provided between the "1" write state and the "0" erase state. Here, in the "0" erase state, the threshold voltage on the side of the plate line PL$_2$ is high due to a substrate bias effect. Therefore, when the voltage applied to the plate line PL$_2$ is set to, for example, the threshold voltage or lower, the first N-channel MOS transistor region on the side of the plate line PL$_2$ becomes non-conducting and does not allow the memory cell current to flow therethrough. This state is illustrated in the right part of FIG. 4C and indicated as "PL: non-conducting".

The description of the mechanism of the page erase operation illustrated in FIG. 4BA will be continued. Subsequently, from T1*l* to T12, the voltage of the bit lines BL$_1$ to BL$_3$ drops from V$_{BLH}$ to Vss and that of the source line SL drops from V$_{SLH}$ to Vss, and the erase operation ends. At this time, although the bit lines BL$_1$ to BL$_3$ and the source line SL slightly decrease the voltage of the channel region 7 due to capacitive coupling, this decrease is equal to the increase in the voltage of the channel region 7 by the bit lines BL$_1$ to BL$_3$ and the source line SL from time T7 to time T8 due to capacitive coupling, and therefore, the decrease and the increase in the voltage by the bit lines BL$_1$ to BL$_3$ and the source line SL are canceled out, and the voltage of the channel region 7 is not affected consequently. The page erase operation in which the voltage V$_{FH}$"0" in the "0" erase state of the channel region 7 is assumed to be a second data retention voltage (which is an example of "second data retention voltage" in the claims) is performed to assign logical storage data "0".

Now, a mechanism of the page erase operation will be described with reference to FIGS. 4DA to 4DD. FIGS. 4DA to 4DD are different from FIGS. 4BA to 4BD in that the bit lines BL$_1$ to BL$_3$ are kept at Vss or put in a floating state and the word line WL$_2$ is kept at Vss during the page erase operation. Accordingly, from T1 to T2, even when the source line SL rises from Vss to V$_{SLH}$, the second N-channel MOS transistor region of the word line WL$_2$ is non-conducting, and the memory cell current does not flow therethrough. Therefore, the group of positive holes 9 caused by an impact ionization phenomenon are not generated. The others are the same as in FIGS. 4BA to 4BD, and the source line SL changes between Vss and V$_{SLH}$, and the plate line PL$_2$ changes between V$_{PLL}$ and V$_{PLH}$. As a result, as illustrated in FIG. 4DC, the group of positive holes 9 are discharged to the first impurity layer, namely, the N$^+$ layer 3$a$, of the source line SL.

Now, a mechanism of the page erase operation will be described with reference to FIGS. 4EA to FIG. 4ED. FIGS. 4EA to FIG. 4ED are different from FIGS. 4BA to 4BD in that the source line SL is kept at Vss or put in a floating state and the plate line PL$_2$ is kept at Vss during the page erase operation. Accordingly, from T1 to T2, even when the bit lines BL$_1$ to BL$_3$ rise from Vss to V$_{BLH}$, the first N-channel MOS transistor region of the plate line PL$_2$ is non-conducting, and the memory cell current does not flow therethrough. Therefore, the group of positive holes 9 caused by an impact ionization phenomenon are not generated. The others are the same as in FIGS. 4BA to 4BD, and the bit lines BL$_1$ to BL$_3$ change between Vss and V$_{BLH}$, and the word line WL$_2$ changes between Vss and V$_{WLH}$. As a result, as illustrated in FIG. 4EC, the group of positive holes 9 are discharged to the second impurity layer, namely, the N$^+$ layer 3$b$, of the bit line BL$_1$, BL$_2$, or BL$_3$.

Note that the conditions of voltages applied to the bit line BL, the source line SL, the word line WL, and the plate line PL and the potential of the floating body described above are examples for performing the page erase operation, and other operation conditions based on which the page erase operation can be performed may be employed.

Figure 5A:
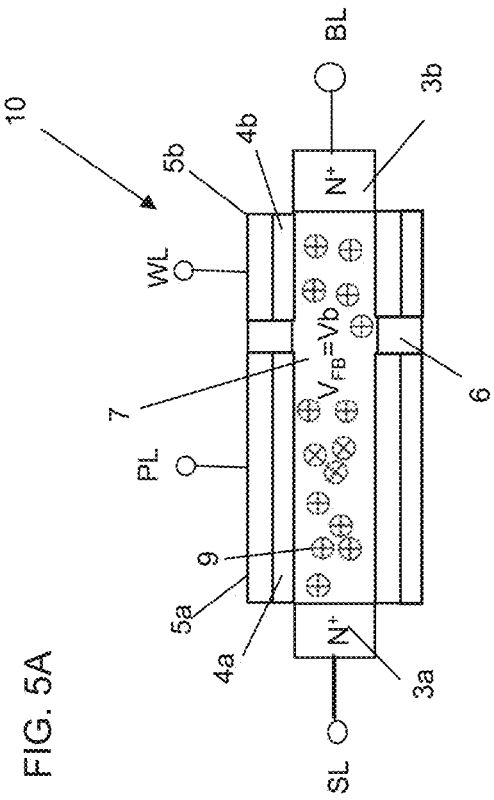
FIGS. 5A, 5B and 5C are diagrams for explaining a mechanism of a read operation of the SGT-including memory device according to the first embodiment.
Figure 5B:
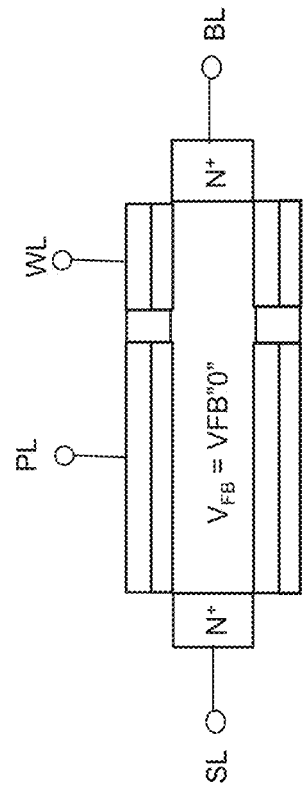
Figure 5C:
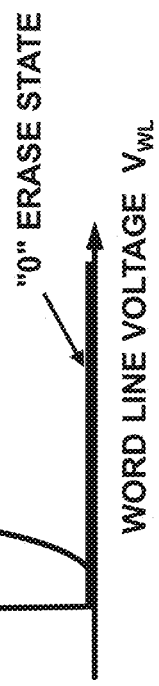

FIGS. 5A to 5C are diagrams for explaining a read operation of the dynamic flash memory cell according to the first embodiment of the present invention. As illustrated in FIG. 5A, when the channel region 7 is charged up to the built-in voltage Vb (about 0.7 V), the threshold voltage for the second N-channel MOS transistor region including the second gate conductor layer 5$b$ to which the word line WL is connected decreases due to a substrate bias effect. This state is assigned to logical storage data "1". As illustrated in FIG. 5B, a memory block selected before writing is in an erase state "0" in advance, and the voltage V$_{FB}$ of the channel region 7 is equal to V$_{FB}$"0". With a write operation, a write state "1" is stored at random. As a result, logical storage data of logical "0" and that of logical "1" are created for the word line WL. As illustrated in FIG. 5C, the level difference between the two threshold voltages of the word line WL is used to perform reading by a sense amplifier.

Note that the conditions of voltages applied to the bit line BL, the source line SL, the word line WL, and the plate line PL and the potential of the floating body described above are examples for performing the read operation, and other operation conditions based on which the read operation can be performed may be employed.

An operation of setting the plate line PL of a non-selected page of the dynamic flash memory according to the first embodiment of the present invention at a negative voltage will be described with reference to FIG. 6A to FIG. 6H.

Figure 6A:
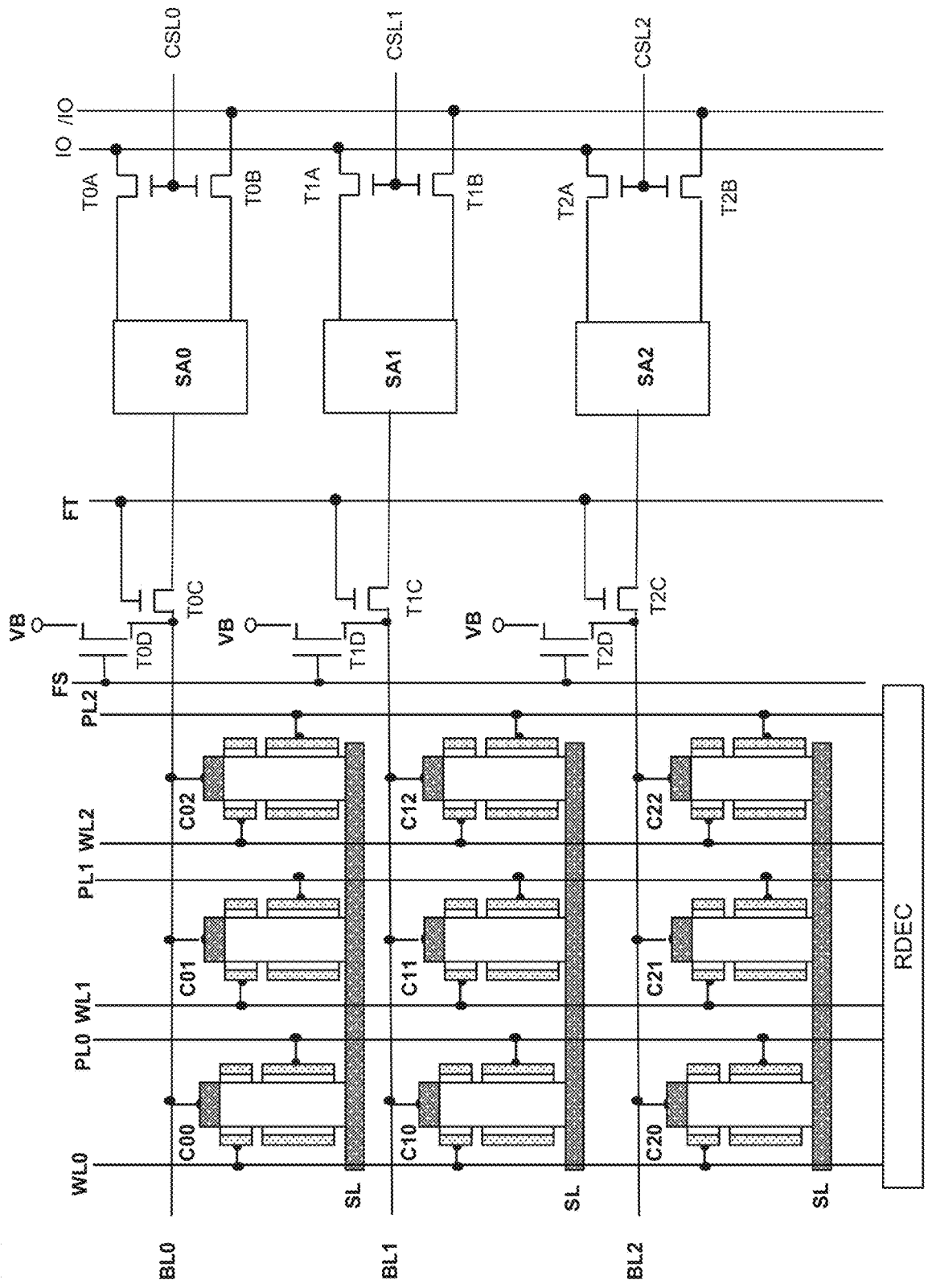
FIG. 6A is a circuit block diagram for explaining an operation of setting a plate line of a non-selected page of the SGT-including memory device according to the first embodiment at a negative voltage.
Figure 6C:
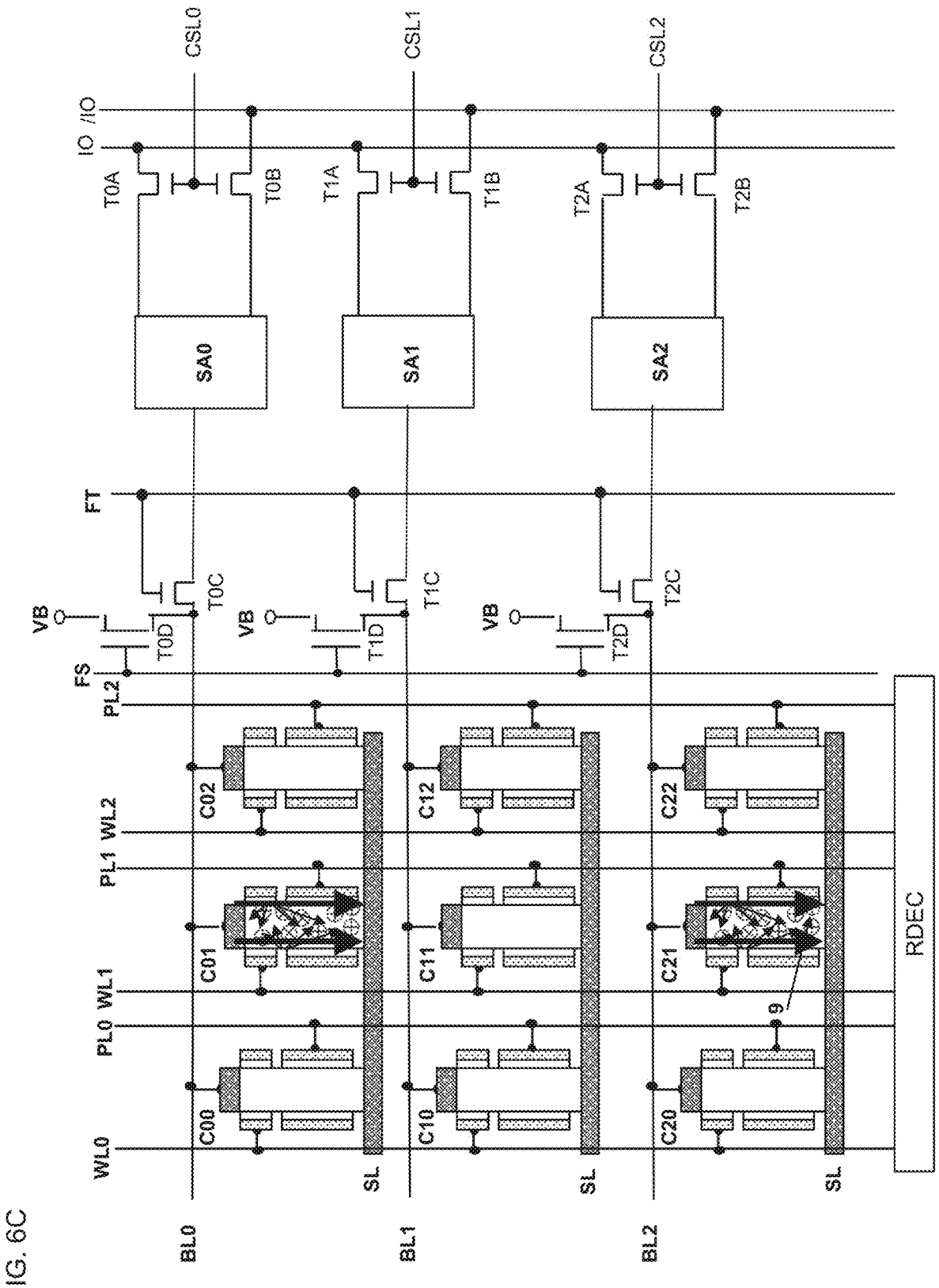
FIG. 6C is a circuit block diagram for explaining the operation of setting a plate line of a non-selected page of the SGT-including memory device according to the first embodiment at a negative voltage.

In FIG. 6A, memory cells C00 to C22 in three rows and three columns constitute a part of a memory cell block. Although the memory cells C00 to C22 in three rows and three columns are illustrated in FIG. 6A, memory cells in a matrix larger than three rows and three columns constitute the actual memory cell block. To each of the memory cells, a corresponding one of the word lines WL0 to WL2, a corresponding one of the plate lines PL0 to PL2, the source line SL, and a corresponding one of the bit lines BL0 to BL2 are connected. Transistors T0C to T2C each having a gate to which a transfer signal FT is input constitute a switch circuit. The drains of transistors T0D to T2D each having a gate connected to a bit line pre-charge signal FS are connected to a bit line power VB, and the sources thereof are connected to the bit lines BL0 to BL2 respectively. The bit lines BL0 to BL2 are respectively connected to sense amplifier circuits (which are an example of "sense amplifier circuits" in the claims) SA0 to SA2 with the transistors T0C to T2C, which constitute the switch circuit, therebetween. The word lines WL0 to WL2 and the plate lines PL0 to PL2 are connected to a row decoder circuit RDEC. The sense amplifier circuits SA0 to SA2 are connected to a pair of complementary input/output lines IO and /IO, with transistors T0A to T2B each having a gate connected to a corresponding one of column selection lines CSL0 to CSL2 therebetween. FIG. 6A illustrates a state in which, for example, the erase operation illustrated in FIG. 4BA is performed in advance in the entire memory cell block and the group of positive holes 9 are not accumulated in the channel regions 7.

FIG. 6B is an operation waveform diagram illustrating a case where "1" is written to the memory cells C01 and C21 at random among the memory cells COO to C22 illustrated in FIG. 6A and the group of positive holes 9 are accumulated in the channel region 7 of each of the memory cells. At a first time T1 before the start of a page write operation, a first voltage V1 is applied to the word lines WL0 to WL2. Here, the first voltage V1 is, for example, a ground voltage (which is an example of "ground voltage" in the claims) Vss that is equal to 0 V. To the plate lines PL0 to PL2, a third voltage V3 that is a voltage lower than or equal to zero volt and that is equal to, for example, −0.7 V is applied. Accordingly, most of the group of positive holes 9 accumulated in the channel region 7 of a memory cell in a non-selected page are present near the plate line PL0, PL1, or PL2. As a result, re-coupling between positive holes and electrons at the PN junction between the bit line BL and the channel region 7 is suppressed. When a voltage lower than or equal to zero volt is applied to the plate lines PL0 to PL2, the inversion layer 12a in the channel region 7 disappears. Therefore, a decrease in the group of positive holes 9 that serve as a signal is prevented. To the bit lines BL0 to BL2 and the source line SL, the first voltage V1 is applied.

When a page write operation is started at a second time T2 in FIG. 6B, the word line WL1 of a selected page rises from the first voltage V1 to a second voltage V2. Here, the second voltage V2 is equal to, for example, 2.0 V. The plate line PL1 of the selected page rises from the third voltage V3 to a fourth voltage V4. Here, the fourth voltage V4 is equal to, for example, 1.3 V. The bit lines BL0 and BL2 through which "1" is written rise from the first voltage V1 to a fifth voltage V5. Here, the fifth voltage V5 is equal to, for example, 0.8 V. Erasing is performed in advance for the memory cells C01 and C21, and therefore, the threshold voltage for the first N-channel MOS transistor region and that for the second N-channel MOS transistor region are, for example, 1.2 V and high. Therefore, the first N-channel MOS transistor region operates in the saturation region, and the second N-channel MOS transistor region operates in the linear region. As a result, a source-side impact ionization phenomenon occurs between the first N-channel MOS transistor region and the second N-channel MOS transistor region, and the group of positive holes 9 are accumulated in the channel region 7 of each of the memory cells C01 and C21 as illustrated by the circuit block diagram in FIG. 6C.

After the voltage of the channel region 7 in each of the memory cells C01 and C21 has reached the first data retention voltage that is a desired voltage, at a third time T3, the word line WL1 of the selected page drops from the second voltage V2 to the first voltage V1, the plate line PL1 of the selected page drops from the fourth voltage V4 to the third voltage V3, the bit lines BL0 and BL2 through which "1" has been written drop from the fifth voltage V5 to the first voltage V1, and the page write operation ends. Therefore, from the third time T3 onward, the third voltage V3 that is a voltage lower than or equal to zero volt and that is equal to, for example, −0.7 V is applied to all the plate lines PL0 to PL2. Accordingly, most of the group of positive holes 9 accumulated in the channel region 7 of a memory cell in a non-selected page are present near the plate line PL0, PL1, or PL2. As a result, re-coupling between positive holes and electrons at the PN junction between the bit line BL and the channel region 7 is suppressed. When a negative voltage is applied to the plate lines PL0 to PL2, the inversion layer 12a in the channel region 7 disappears. Therefore, a decrease in the group of positive holes 9 that serve as a signal is prevented. Although FIG. 6B illustrates a case where the word line WL1, the bit lines BL0 and BL2, and the plate line PL1 simultaneously rise at T2 when page writing is started and simultaneously drop at T3 when the page writing ends, any of the word line WL1, the bit lines BL0 and BL2, and the plate line PL1 may rise or drop first in the order of rise or drop. A slight gap may be allowed between the timings of rise or drop.

Figure 6D:
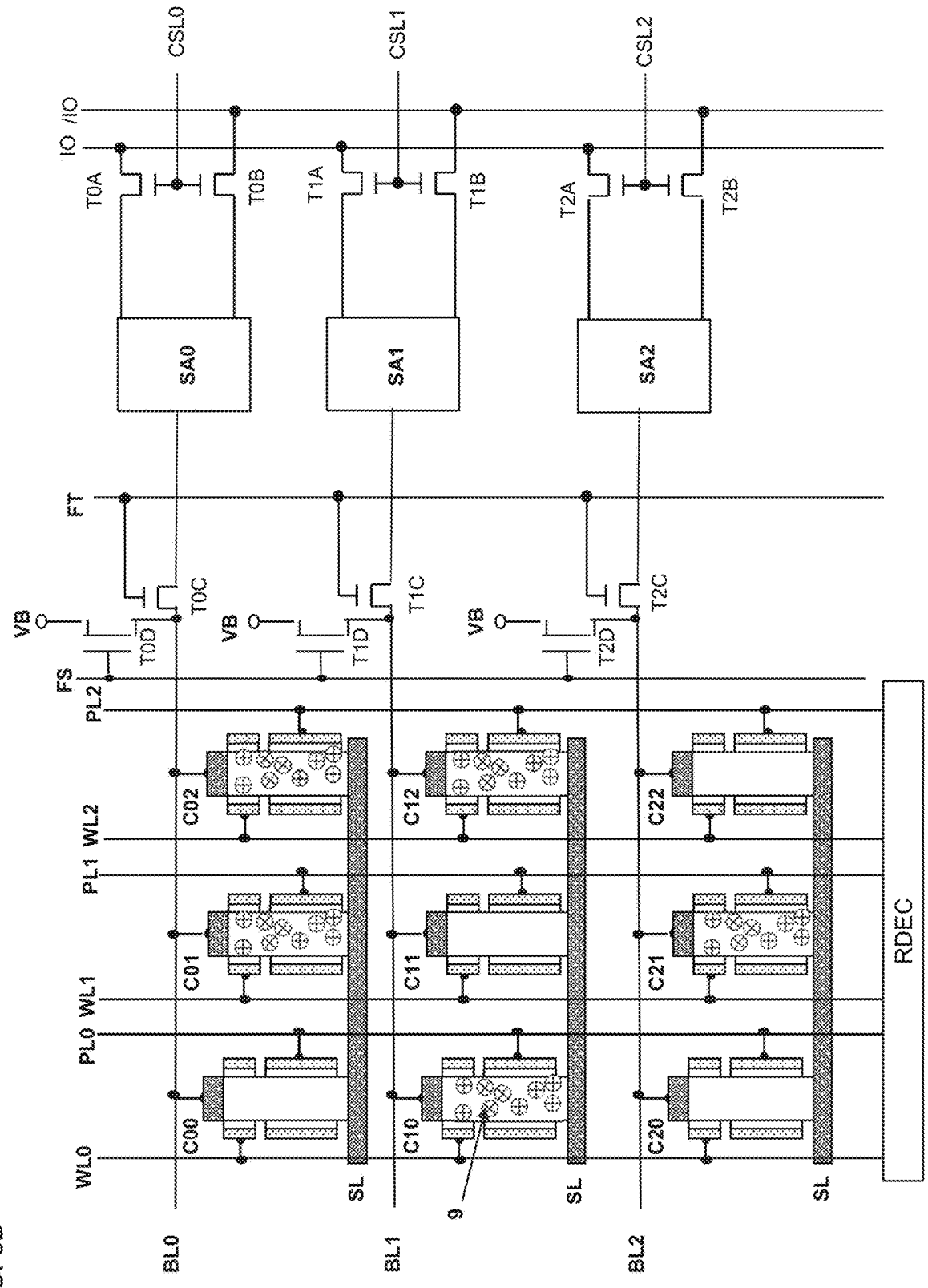
FIG. 6D is a circuit block diagram for explaining the operation of setting a plate line of a non-selected page of the SGT-including memory device according to the first embodiment at a negative voltage.
Figure 6E:
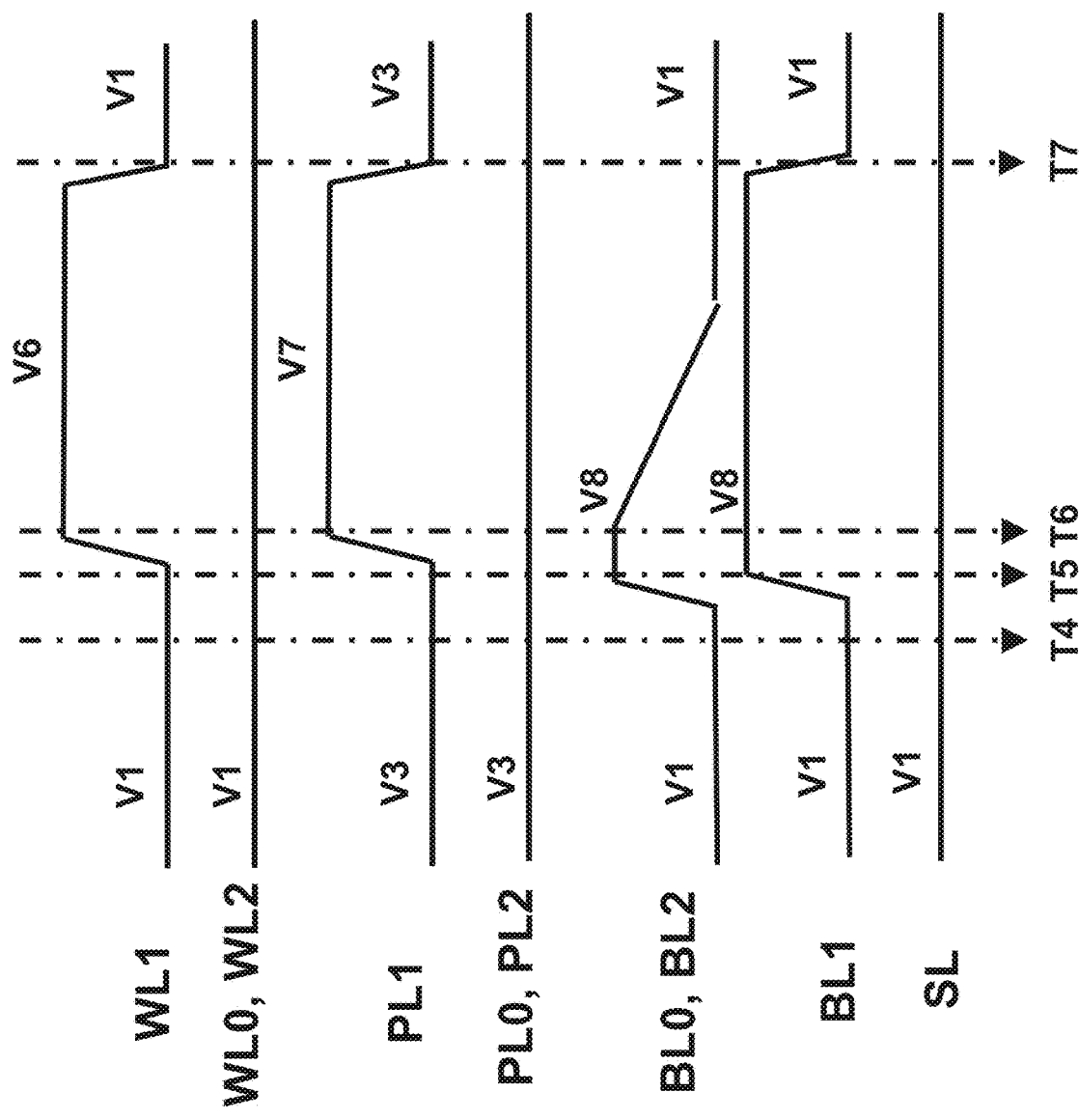
FIG. 6E is an operation waveform diagram for explaining the operation of setting a plate line of a non-selected page of the SGT-including memory device according to the first embodiment at a negative voltage.

FIG. 6D is a circuit block diagram illustrating a state in which, at a certain timing, "1" is written to the memory cells C10, C01, C21, C02, and C12 at random among the memory cells COO to C22 and the group of positive holes 9 are accumulated in the channel region 7 of each of the memory cells. FIG. 6E is an operation waveform diagram when the memory cells illustrated in FIG. 6D are read. At a fourth time T4 before the start of a page read operation (which is an example of "page read operation" in the claims), the first voltage V1 is applied to the word lines WL0 to WL2. Here, the first voltage V1 is, for example, the ground voltage Vss that is equal to 0 V. To the plate lines PL0 to PL2, the third voltage V3 that is a voltage lower than or equal to zero volt and that is equal to, for example, −0.7 V is applied. Accordingly, most of the group of positive holes 9 accumulated in the channel region 7 of a memory cell in a non-selected page are present near the plate line PL0, PL1, or PL2. As a result, re-coupling between positive holes and electrons at the PN junction between the bit line BL and the channel region 7 is suppressed. When a voltage lower than or equal to zero volt is applied to the plate lines PL0 to PL2, the inversion layer 12a in the channel region 7 disappears. Therefore, a decrease in the group of positive holes 9 that serve as a signal is prevented. To the bit lines BL0 to BL2 and the source line SL, the first voltage V1 is applied.

Figure 6F:
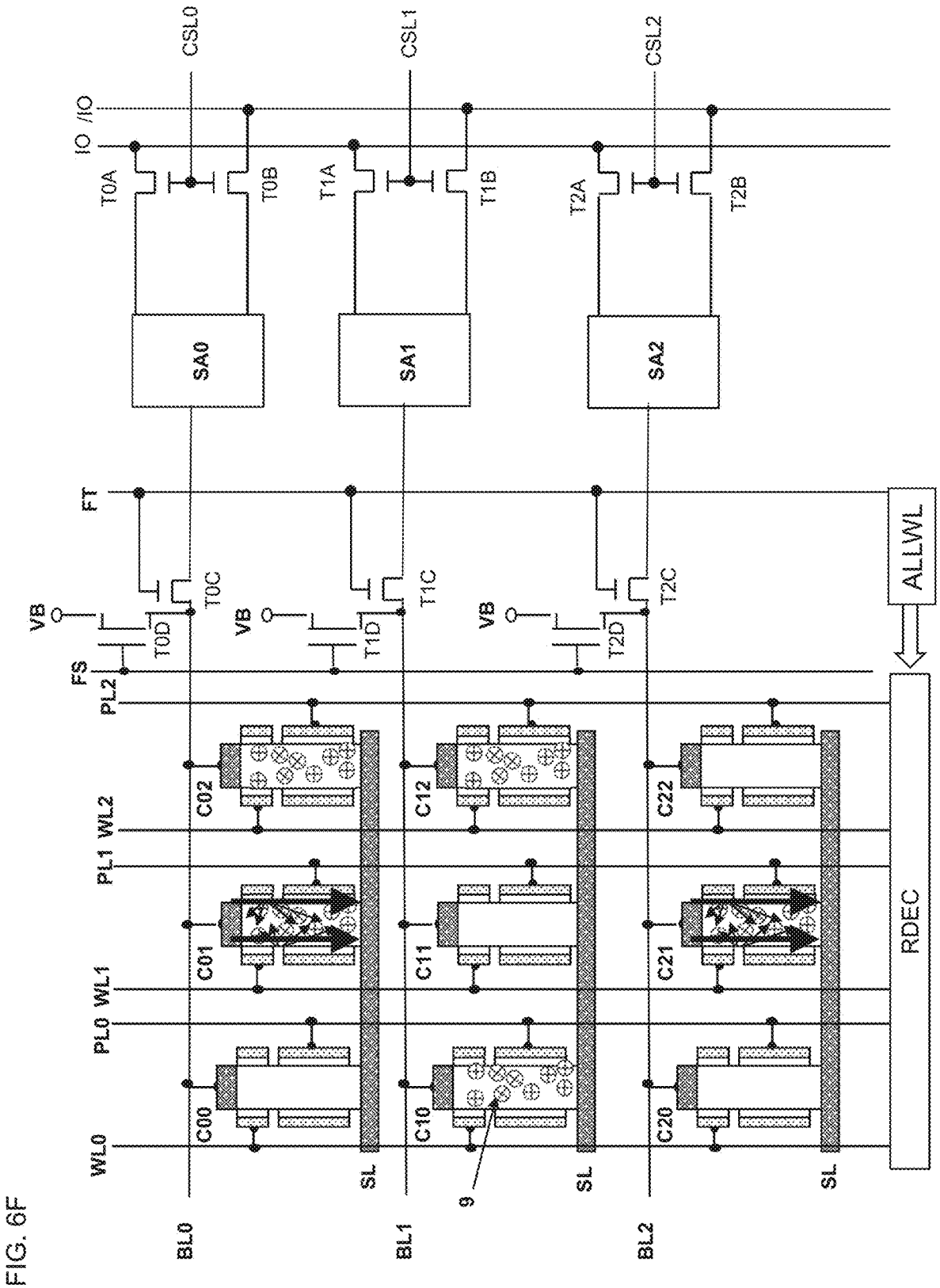
FIG. 6F is a circuit block diagram for explaining the operation of setting a plate line of a non-selected page of the SGT-including memory device according to the first embodiment at a negative voltage.

When a page read operation is started at a fifth time T5 in FIG. 6E, all the bit lines BL0 to BL2 are preliminarily charged from the first voltage V1 to an eighth voltage V8. Here, the eighth voltage V8 is equal to, for example, 0.8 V. At a sixth time T6, the word line WL1 of a selected page rises from the first voltage V1 to a sixth voltage V6. Here, the sixth voltage V6 is equal to, for example, 1.0 V. The plate line PL1 of the selected page rises from the third voltage V3 to a seventh voltage V7. Here, the seventh voltage V7 is equal to, for example, 0.8 V. As a result, page data (which is an example of "page data" in the claims) stored in a first group of memory cells C01, C11, and C21 (which is an example of "group of memory cells" in the claims) belonging to a first page is read to the bit lines BL0 to BL2. To the memory cells C01 and C21, "1" has been written, and therefore, a memory cell current flows as illustrated in FIG. 6F, and the bit lines BL0 and BL2 are discharged. In contrast, the memory cell C11 remains in a "0" erase state, and therefore, a memory cell current does not flow. Although FIG. 6E illustrates a case where the word line WL1, the bit line BL1, and the plate line PL1 simultaneously drop at T7 when page reading ends, any of the word line WL1, the bit line BL1, and the plate line PL1 may drop first in the order of drop. A slight gap may be allowed between the timings of drop.

When a memory cell current flows through each of the memory cells C01 and C21 as illustrated in FIG. 6F, the group of positive holes 9 are re-generated inside the channel regions 7 by an impact ionization phenomenon. As a result, a refresh operation (which is an example of "refresh operation" in the claims) of returning to the first data retention voltage, the voltage of the channel region 7, in the selected page, to which "1" has been written can be automatically performed. The page data read to the bit lines BL0 to BL2 are read to the sense amplifier circuits SA0 to SA2.

At the seventh time T7 in FIG. 6E, the word line WL1 of the selected page drops from the sixth voltage V6 to the first voltage V1, the plate line PL1 of the selected page drops from the seventh voltage V7 to the third voltage V3, the bit lines BL0 to BL2 are reset to the first voltage V1, and the page read operation ends. Therefore, from the seventh time T7 onward, the third voltage V3 that is a voltage lower than or equal to zero volt and that is equal to, for example, −0.7 V is applied to all the plate lines PL0 to PL2. Accordingly, most of the group of positive holes 9 accumulated in the channel region 7 of a memory cell in a non-selected page are present near the plate line PL0, PL1, or PL2. As a result, re-coupling between positive holes and electrons at the PN junction between the bit line BL and the channel region 7 is suppressed. When a voltage lower than or equal to zero volt is applied to the plate lines PL0 to PL2, the inversion layer 12a in the channel region 7 disappears. Therefore, a decrease in the group of positive holes 9 that serve as a signal is prevented.

Although a case where the bit lines are preliminarily charged to the eighth voltage V8 to perform reading from the memory cells C01 to C21 to the bit lines BL0 to BL2 has been described, the transistors T0D to T2D may be used as load transistors of the bit lines, and the conducting currents of the load transistors may be opposed against the memory cell currents to thereby perform static reading from the memory cells C01 to C21 to the bit lines BL0 to BL2.

In FIG. 6D, a page sum-of-products read operation (which is an example of "page sum-of-products read operation" in the claims) in which at least two word lines are selected in multiple selection can be performed. In the page sum-of-products read operation, for example, the three word lines WL0 to WL2 in FIG. 6D are selected in multiple selection. Memory cell currents Icell are added up for each of the bit lines BL0 to BL2. In this case, static reading in which the memory cell currents are opposed against the conducting currents of the load transistors is desirable.

Figure 6G:
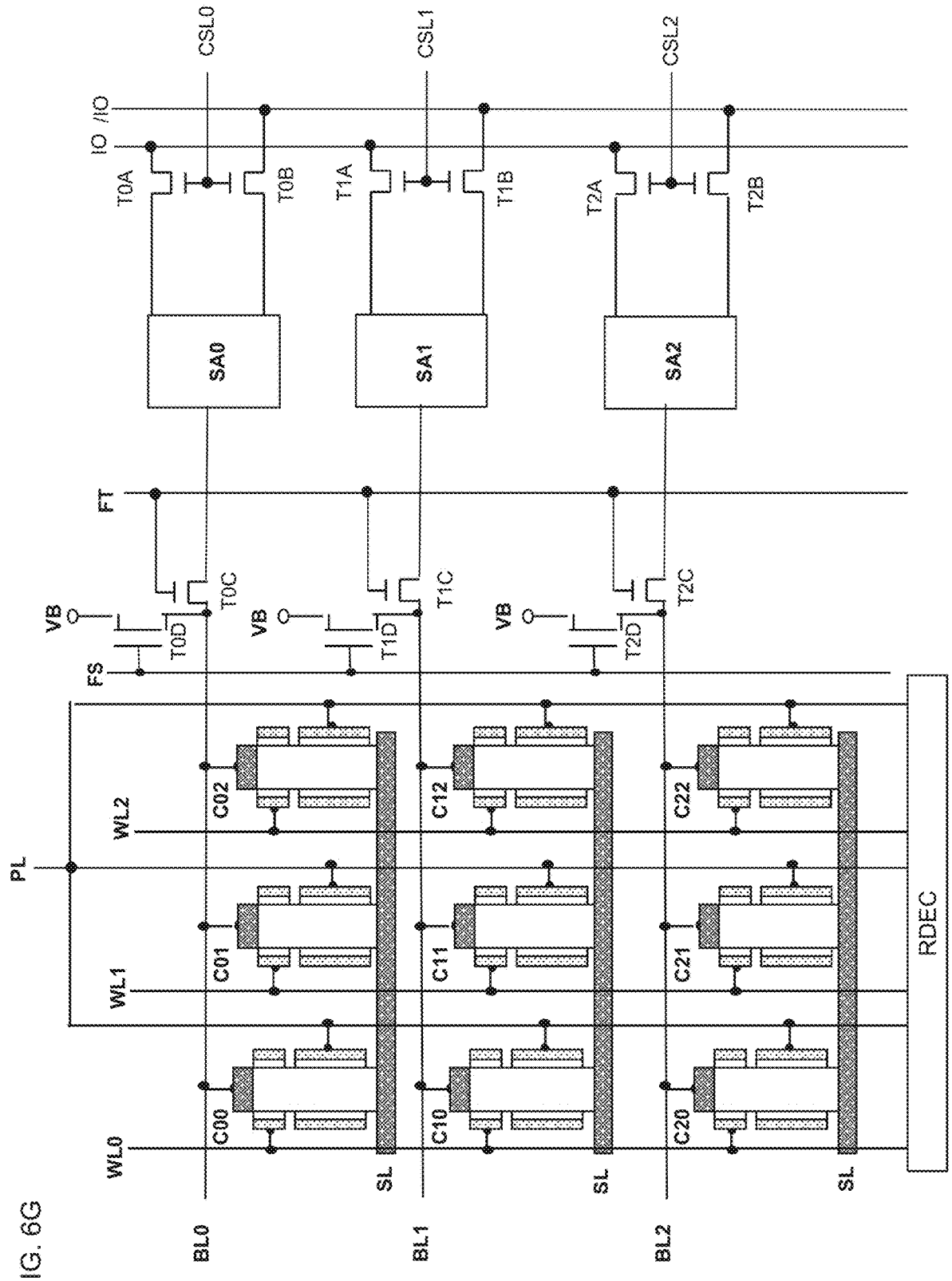
FIG. 6G is a circuit block diagram for explaining the operation of setting a plate line of a non-selected page of the SGT-including memory device according to the first embodiment at a negative voltage.

FIG. 6G illustrates an example where the plate line PL is shared among adjacent memory cells in the block constituted by the memory cells C00 to C22 in three rows and three columns. In this configuration, in at least one of the page write operation or the page read operation or in both of the operations of the dynamic flash memory according to the first embodiment of the present invention, the plate line PL of a non-selected page can also be set at a negative voltage.

Figure 6H:
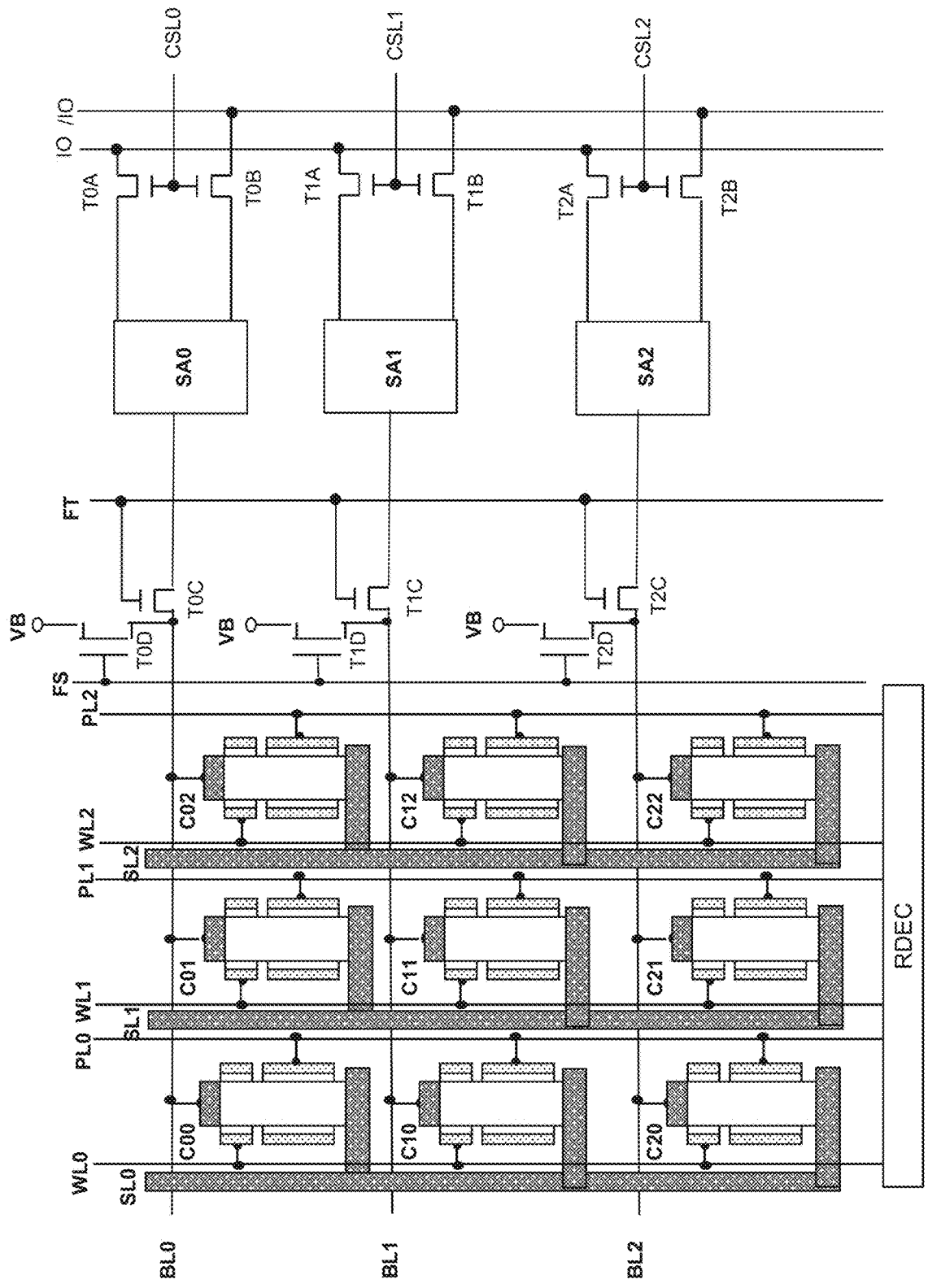
FIG. 6H is a circuit block diagram for explaining the operation of setting a plate line of a non-selected page of the SGT-including memory device according to the first embodiment at a negative voltage.
Figure 8A:
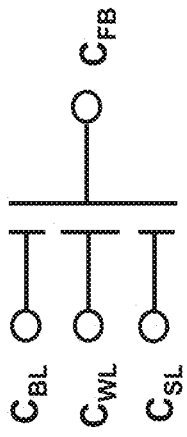
FIGS. 8A and 8B are diagrams for explaining a problem in the operation of the DRAM memory cell including no capacitor in the related art.
Figure 8B:
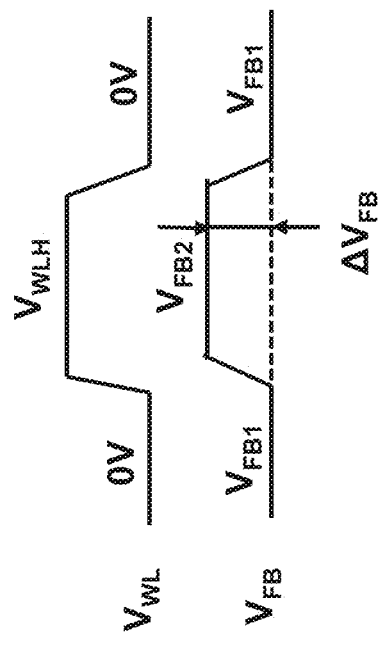
Figure 9C:
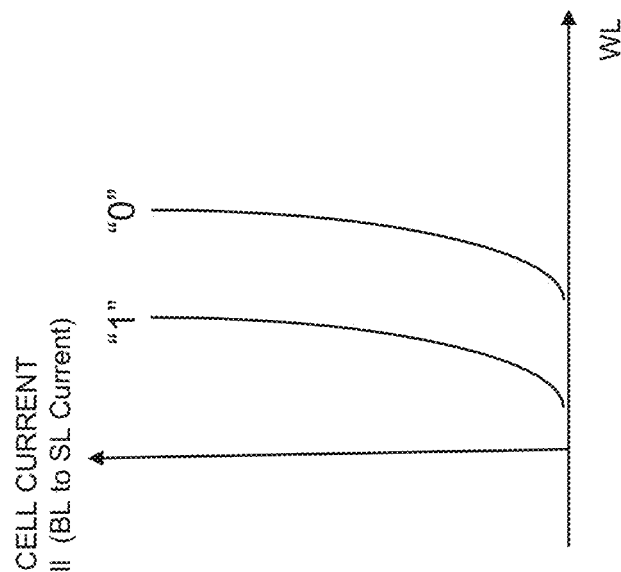
FIGS. 9A, 9B and 9C are diagrams for explaining a read operation of the DRAM memory cell including no capacitor in the related art.
Figure 9A:
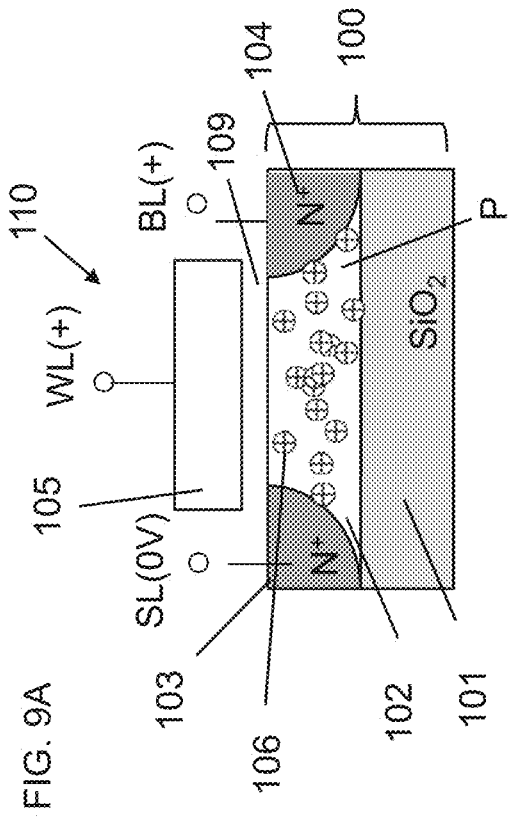
Figure 9B:
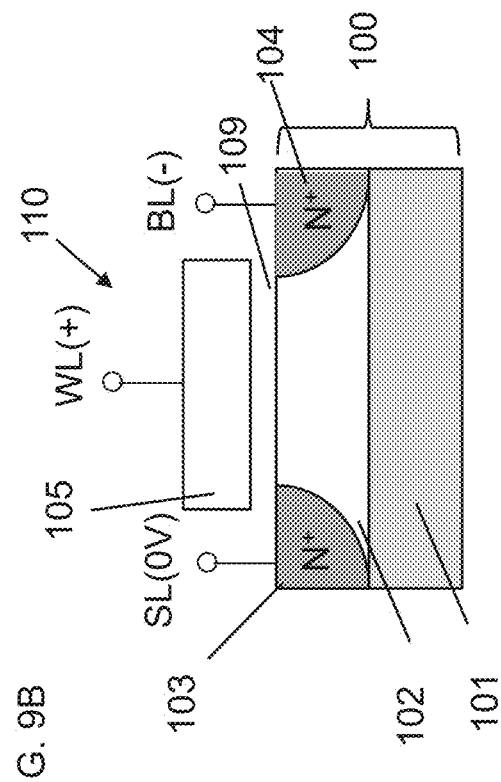
Figure 10:
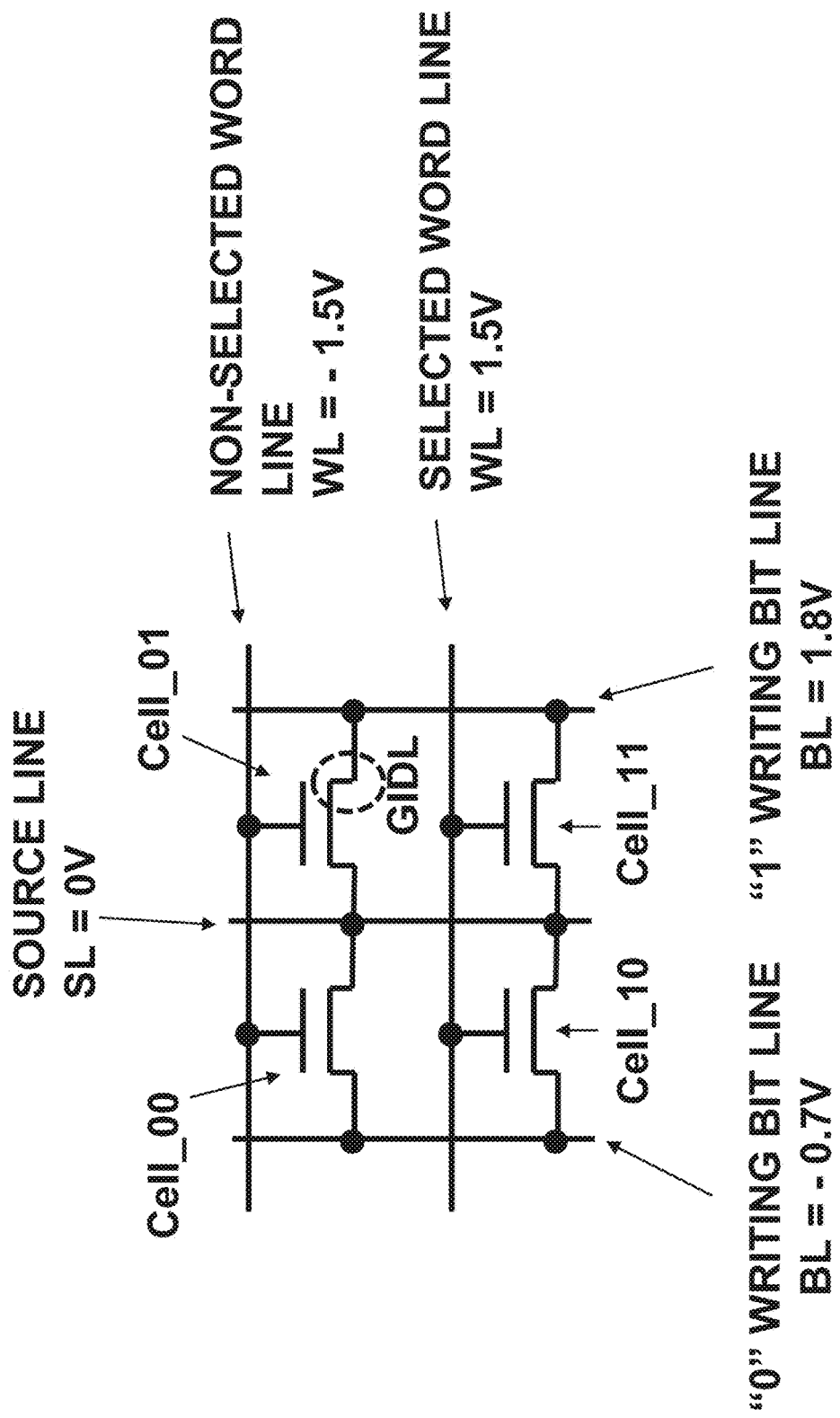
FIG. 10 is a diagram for explaining a problem in a write operation in a memory cell block in the related art.

FIG. 6H illustrates an example where isolated source lines, namely, a source line SL0 parallel to the plate line PL0 and the word line WL0, a source line SL1 parallel to the plate line PL1 and the word line WL1, and a source line SL2 parallel to the plate line PL2 and the word line WL2, are disposed in the block constituted by the memory cells C00 to C22 in three rows and three columns. In this configuration, in at least one of the page write operation or the page read operation or in both of the operations of the dynamic flash memory according to the first embodiment of the present invention, the plate line PL of a non-selected page can also be set at a voltage lower than or equal to zero volt.

Regardless of whether the horizontal cross-sectional shape of the Si pillar 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulating layer 4a and the second gate insulating layer 4b that surround the entire side surface of the Si pillar 2 standing on the substrate in the vertical direction are provided and which includes the first gate conductor layer 5a and the second gate conductor layer 5b that entirely surround the first gate insulating layer 4a and the second gate insulating layer 4b has been described. As indicated in the description of this embodiment, the dynamic flash memory element needs to have a structure that satisfies the condition that the group of positive holes 9 generated by an impact ionization phenomenon are retained in the channel region 7. For this, the channel region 7 needs to have a floating body structure isolated from the substrate. Accordingly, even when the semiconductor base material of the channel region is formed horizontally along the substrate by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A design of a capacitorless 1T-DPAM cell using gate-induced drain leakage (GIDL) current for low-power and high-speed embedded memory", IEEE IEDM, pp. 913-916, December 2003). In this device structure, the bottom portion of the channel region is in contact with an insulating layer of the SOI substrate, and the other portion of the channel region is surrounded by a gate insulating layer and an element isolation insulating layer. With such a structure, the channel region also has a floating body structure. Accordingly, the dynamic flash memory element provided in this embodiment needs to satisfy the condition that the channel region has a floating body structure. Even with a structure in which a Fin transistor (see, for example, H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 (2014) 115021 (7 pp)) is formed on an SOI substrate, as long as the channel region has a floating body structure, the dynamic flash operations can be performed.

Expressions (1) to (12) provided in the specification and in the drawings are expressions used to qualitatively explain the phenomena, and are not intended to limit the phenomena.

Although the reset voltages of the word line WL, the bit line BL, and the source line SL are specified as Vss in the descriptions of FIGS. 3AA to 3AC and FIG. 3B, the reset voltages of the respective lies may be set to different voltages.

Although FIG. 4BA, FIG. 4DA, and FIG. 4EA and the descriptions thereof illustrate example conditions of the page erase operation, the voltages applied to the source line SL, the plate line PL, the bit line BL, and the word line WL may be changed as long as a state in which the group of positive holes 9 in the channel region 7 are discharged through either the N$^+$ layer 3a or the N$^+$ layer 3b or both the N layer 3a and the N$^+$ layer 3b can be attained. Further, in the page erase operation, a voltage may be applied to the source line SL of a selected page, and the bit line BL may be put in a floating state. In the page erase operation, a voltage may be applied to the bit line BL of a selected page, and the source line SL may be put in a floating state.

In FIG. 1, in the vertical direction, in a part of the channel region 7 surrounded by the insulating layer 6 that is the first insulating layer, the potential distribution of the first channel region 7a and that of the second channel region 7b are connected and formed. Accordingly, the first channel region 7a and the second channel region 7b that constitute the channel region 7 are connected in the vertical direction in the region surrounded by the insulating layer 6 that is the first insulating layer.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL} > C_{WL}$. However, when only the plate line PL is added, the coupling ratio ($C_{WL}/(C_{PL}+C_{WL}+C_{BL}+C_{SL})$), of capacitive coupling, of the word line WL to the channel region 7 decreases. As a result, the potential change $\Delta V_{FB}$ of the channel region 7 that is a floating body decreases.

Although specific voltages of the bit lines BL, the word lines WL, and the plate lines PL are indicated in the operation waveform diagrams in FIG. 6B and FIG. 6E, any voltage conditions may be employed as long as an impact ionization phenomenon is made to occur inside the channel region 7 with a memory cell current and the group of positive holes 9 are generated.

Note that in the specification and the claims, the meaning of "cover" in a case of "for example, a gate insulating layer or a gate conductor layer covers, for example, a channel" also includes a case of surrounding entirely as in an SGT or GAA, a case of surrounding except a portion as in a Fin transistor, and a case of overlapping a flat object as in a planar transistor.

Although the first gate conductor layer Sa entirely surrounds the first gate insulating layer 4a in FIG. 1, a structure may be employed in which the first gate conductor layer 5a partially surrounds the first gate insulating layer 4a in plan view. The first gate conductor layer 5a may be divided into at least two gate conductor layers, and the gate conductor layers may each be operated as a plate line PL electrode. Similarly, the second gate conductor layer 5b may be divided into two or more gate conductor layers, and the gate conductor layers may each function as a conductive electrode of the word line and may be operated synchronously or asynchronously. Accordingly, the operations of the dynamic flash memory can be performed.

Although the refresh operation of a one-bit dynamic flash memory cell constituted by a single semiconductor base material has been described with reference to FIG. 6F, the present invention is also effective for the refresh operation of a one-bit high-speed dynamic flash memory cell constituted by two semiconductor base materials that store complementary data of "1" and "0".

Although the refresh operation of a single-layer memory array including one-bit dynamic flash memory cells each constituted by a single semiconductor base material has been described with reference to FIG. 6F, the present invention is also effective for a multilayer memory array including one-bit dynamic flash memory cells stacked in multiple tiers and each constituted by a single semiconductor base material.

In FIG. 1, the first gate conductor layer 5a may be divided into two or more gate conductor layers, and the gate conductor layers may each function as a conductive electrode of the plate line and may be operated synchronously or asynchronously at the same driving voltage or different driving voltages. Similarly, the second gate conductor layer 5b may be divided into two or more gate conductor layers, and the gate conductor layers may each function as a conductive electrode of the word line and may be operated synchronously or asynchronously at the same driving voltage or different driving voltages. In this case, the operations of the dynamic flash memory can also be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as basic operations of the present invention can be performed.

This embodiment has the following features.

Feature 1

The plate line PL of a non-selected page of the dynamic flash memory according to the first embodiment of the present invention is set at a negative voltage. To all the plate lines PL, the third voltage V3 that is a negative voltage and that is equal to, for example, −0.7 V is applied. Accordingly, most of the group of positive holes 9 accumulated in the channel region 7 of a memory cell in the non-selected page are present near the plate line PL. As a result, re-coupling between positive holes and electrons at the PN junction between the bit line BL and the channel region 7 is suppressed. When a negative voltage is applied to the plate lines PL, the inversion layer 12a in the channel region 7 disappears. Therefore, a decrease in the group of positive holes 9 that serve as a signal is prevented. As a result, the retention property of retaining "1" writing with the group of positive holes 9 accumulated in the channel region 7 is significantly improved. T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002) and Takashi Osawa: "SOI DRAM using single FET cell", Applied Physics, Vol. 75, No. 9, pp. 1131-1135, 2006 describe a method for improving the retention property to retain "1" writing for an extended time by setting a non-selected word line WL at −1.5 V. These documents also state that 1.8 V is applied to the bit line BL at the time of writing, and therefore, a voltage of 3.3 V is applied between the gate and the drain and storage data "0" is corrupted in a memory cell connected to the non-selected word line WL due to a gate-induced drain leakage current (GIDL current). In the present invention, even when a voltage lower than or equal to zero volt is applied to a non-selected plate line PL, the plate line PL is not in direct contact with the bit line BL. In the present invention, 0 V is applied to a non-selected word line WL, and even when the bit line is set at, for example, 0.8 V at the time of writing, only a voltage of 0.8 V is applied between the gate and the drain, and therefore, a gate-induced drain leakage current is not generated. Therefore, a voltage lower than or equal to zero volt can be applied to the non-selected plate line, the retention property can be significantly improved to retain "1" writing for an extended time, and a highly reliable memory device can be provided.

Feature 2

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages for the SGT transistor of the word line WL indicating logical "0" and logical "1" can be increased. This leads to an increased operation margin of the dynamic flash memory cell.

Other Embodiments

Although the Si pillar is formed in the present invention, the Si pillar may be a semiconductor pillar made of a semiconductor material other than Si. This is similarly applicable to other embodiments according to the present invention.

Even with a structure in which the conductivity type that is the polarity of each of the N+ layers 3a and 3b and the P-layer Si pillar 2 in FIG. 1 is reversed, the operations of the dynamic flash memory can be performed. In this case, in the Si pillar 2 that is of N-type, the majority carriers are electrons. Therefore, a group of electrons generated by an impact ionization phenomenon are accumulated in the channel region 7, and a "1" state is set.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor-element-including memory device, the memory device comprising a memory block constituted by a plurality of pages arranged in a column direction, each of the pages being constituted by a plurality of memory cells arranged in a row direction on a substrate, each of the memory cells included in each of the pages comprising:

a semiconductor base material that stands on the substrate in a vertical direction or that extends along the substrate in a horizontal direction;

a first impurity layer and a second impurity layer that are disposed at respective ends of the semiconductor base material;

a first gate insulating layer that partially or entirely surrounds a side surface of the semiconductor base material between the first impurity layer and the second impurity layer and that is in contact with or in close vicinity to the first impurity layer;

a second gate insulating layer that surrounds the side surface of the semiconductor base material, that is connected to the first gate insulating layer, and that is in contact with or in close vicinity to the second impurity layer;

a first gate conductor layer that partially or entirely covers the first gate insulating layer;

a second gate conductor layer that covers the second gate insulating layer; and a channel semiconductor layer that is the semiconductor base material and that is covered by the first gate insulating layer and the second gate insulating layer, wherein the first impurity layer of each of the memory cells is connected to a source line, the second impurity layer thereof is connected to a corresponding one of bit lines, one of the first gate conductor layer or the second gate conductor layer thereof is connected to a corresponding one of word lines, the other of the first gate conductor layer or the second gate conductor layer thereof is connected to a corresponding one of driving control lines, and each of the bit lines is connected to a corresponding one of sense amplifier circuits, voltages applied to the first gate conductor layer, the second gate conductor layer, the first impurity layer, and the second impurity layer are controlled to retain a group of positive holes, inside the channel semiconductor layer, generated by an impact ionization phenomenon, in a page write operation, a voltage of the channel semiconductor layer is made equal to a first data retention voltage that is higher than the voltage of either the first impurity layer or the second impurity layer or that is higher than the voltages of both the first impurity layer and the second impurity layer, in a page erase operation, the voltages applied to the first impurity layer, the second impurity layer, the first gate conductor layer, and the second gate conductor layer are controlled to discharge the group of positive holes through either the first impurity layer or the second impurity layer or both the first impurity layer and the second impurity layer, and subsequently, the voltage of the channel semiconductor layer is made equal to a second data retention voltage that is lower than the first data retention voltage by capacitive coupling between the first gate conductor layer and the channel semiconductor layer and capacitive coupling between the second gate conductor layer and the channel semiconductor layer, in a page read operation, page data of a group of memory cells in at least one selected page among the pages is read to the bit lines, and to a driving control line, among the driving control lines, connected to memory cells in a non-selected page among the pages, a voltage lower than or equal to zero volt is applied while the memory device is operating.

2. The semiconductor-element-including memory device according to claim 1, wherein in the page read operation, in the page write operation, and in the page erase operation, a voltage lower than or equal to zero volt is applied to a non-selected driving control line among the driving control lines.

3. The semiconductor-element-including memory device according to claim 1, wherein in the page read operation, to a driving control line, among the driving control lines, connected to memory cells in a selected page among the pages, a voltage higher than or equal to a ground voltage is applied.

4. The semiconductor-element-including memory device according to claim 1, wherein in the page read operation, a refresh operation of returning the voltage of the channel semiconductor layer in a selected page among the pages to the first data retention voltage by the group of positive holes generated, inside the channel semiconductor layer in the selected page, by an impact ionization phenomenon is performed.

5. The semiconductor-element-including memory device according to claim 1, wherein as the driving control lines of the memory cells arranged in the row direction and in the column direction, a driving control line is disposed so as to be shared among the memory cells adjacent to each other.

6. The semiconductor-element-including memory device according to claim 1, wherein a first gate capacitance between the first gate conductor layer and the channel semiconductor layer is larger than a second gate capacitance between the second gate conductor layer and the channel semiconductor layer.

7. The semiconductor-element-including memory device according to claim 1, wherein the first gate conductor layer is isolated into at least two conductor layers around the first gate insulating layer when viewed in an axial direction of the semiconductor base material.

8. The semiconductor-element-including memory device according to claim 1, wherein a first pulse width of the word lines and the bit lines in a refresh operation is longer than a second pulse width of the word lines and the bit lines in the page read operation.

9. The semiconductor-element-including memory device according to claim 1, wherein the impact ionization phenomenon occurs inside the channel semiconductor layer in proximity to a part between the first gate conductor layer and the second gate conductor layer and generates the group of positive holes inside the channel semiconductor layer.

10. The semiconductor-element-including memory device according to claim 1, wherein in a page sum-of-products read operation of selecting at least two pages in multiple selection, a voltage higher than or equal to a ground voltage is applied to a selected driving control line among the driving control lines, and a negative voltage is applied to a non-selected driving control line among the driving control lines.

* * * * *